(12) United States Patent
Chinthakindi et al.

(10) Patent No.: US 7,732,295 B2
(45) Date of Patent: Jun. 8, 2010

(54) POST LAST WIRING LEVEL INDUCTOR USING PATTERNED PLATE PROCESS

(75) Inventors: Anil Kumar Chinthakindi, Poughkeepsie, NY (US); Douglas Duane Coolbaugh, Essex Junction, VT (US); John Edward Florkey, Pleasant Valley, NY (US); Jeffrey Peter Gambino, Westford, VT (US); Zhong-Xiang He, Essex Junction, VT (US); Anthony Kendall Stamper, Williston, VT (US); Kunal Vaed, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/170,473

(22) Filed: Jul. 10, 2008

(65) Prior Publication Data
US 2008/0293210 A1 Nov. 27, 2008

Related U.S. Application Data

(62) Division of application No. 11/161,217, filed on Jul. 27, 2005, now Pat. No. 7,410,894.

(51) Int. Cl.
*H01L 21/20* (2006.01)
(52) U.S. Cl. ........... 438/381; 438/622; 257/E21.022
(58) Field of Classification Search ......... 438/381, 438/621, 622; 257/E21.022
See application file for complete search history.

(56) References Cited

U.S. PATENT DOCUMENTS

| | | | |
|---|---|---|---|
| 5,478,773 A | 12/1995 | Dow et al. | |
| 5,874,883 A | 2/1999 | Uemura et al. | |
| 5,917,244 A | 6/1999 | Lee et al. | |
| 6,101,371 A | 8/2000 | Barber et al. | |
| 6,163,957 A | 12/2000 | Jiang et al. | |
| 6,259,160 B1 | 7/2001 | Lopatin et al. | |
| 6,292,086 B1 | 9/2001 | Chu | |
| 6,319,827 B1 | 11/2001 | Kowalski et al. | |

(Continued)

FOREIGN PATENT DOCUMENTS

JP 2232962 9/1990

(Continued)

OTHER PUBLICATIONS

Notice of Allowance (Mail Date Apr. 1, 2009) for U.S. Appl. No. 12/174,047, filed Jul. 16, 2008.

(Continued)

*Primary Examiner*—Michael Trinh
(74) *Attorney, Agent, or Firm*—Schmeiser, Olsen & Watts; Anthony J. Canale

(57) ABSTRACT

A method of forming a semiconductor substrate. A substrate is provided. At least one metal wiring level is within the substrate. A first insulative layer is deposited on a surface of the substrate. A portion of a wire bond pad is formed within the first insulative layer. A second insulative layer is deposited on the first insulative layer. An inductor is within the second insulative layer using a patterned plate process. A remaining portion of the wire bond pad is formed within the second insulative layer, wherein at least a portion of the wire bond pad is substantially co-planar with the inductor.

6 Claims, 35 Drawing Sheets

U.S. PATENT DOCUMENTS

| | | | |
|---|---|---|---|
| 6,387,747 | B1 | 5/2002 | Cha et al. |
| 6,472,721 | B2 | 10/2002 | Ma et al. |
| 6,518,165 | B1 | 2/2003 | Yoon et al. |
| 6,534,374 | B2 * | 3/2003 | Johnson et al. ............. 438/381 |
| 6,582,989 | B2 | 6/2003 | Biegelsen et al. |
| 6,646,534 | B2 | 11/2003 | Ahn et al. |
| 6,664,882 | B2 | 12/2003 | Andoh et al. |
| 6,714,112 | B2 | 3/2004 | Beng et al. |
| 6,727,154 | B2 | 4/2004 | Gardner |
| 6,730,982 | B2 | 5/2004 | Barth et al. |
| 6,869,870 | B2 | 3/2005 | Lin |
| 7,207,096 | B2 * | 4/2007 | Gambino et al. ........... 29/602.1 |
| 7,319,049 | B2 | 1/2008 | Oi et al. |
| 2002/0056888 | A1 | 5/2002 | Depetro |
| 2003/0001712 | A1 | 1/2003 | Zou et al. |
| 2003/0076209 | A1 * | 4/2003 | Tsai et al. ................... 336/200 |
| 2003/0077845 | A1 | 4/2003 | Ohkubo et al. |
| 2003/0179064 | A1 | 9/2003 | Chua et al. |
| 2004/0004266 | A1 | 1/2004 | Furumiya et al. |
| 2004/0157370 | A1 | 8/2004 | Gardner |
| 2004/0195652 | A1 | 10/2004 | Okada |
| 2004/0217443 | A1 | 11/2004 | Davies |
| 2004/0217840 | A1 | 11/2004 | Lee et al. |
| 2005/0167780 | A1 * | 8/2005 | Edelstein et al. ............ 257/531 |

FOREIGN PATENT DOCUMENTS

| | | |
|---|---|---|
| JP | 4280407 | 10/1992 |
| JP | 2000232202 | 8/2000 |

OTHER PUBLICATIONS

Meyer et al.; Si IC-Compatible Inductors and LC Passive Filters; IEEE Journal of Solid-State Circuits, vol. 25, No. 4, Aug. 1990; pp. 1028-1031.

Office Action (Mail Date Jun. 24, 2009) for U.S. Appl. No. 12/174,020, filed Jul. 16, 2008.

Office Action (Mail Date Nov. 20, 2009) for U.S. Appl. No. 12/170,489, filed Jul. 10, 2008.

Office Action (Mail Date Dec. 11, 2009) for U.S. Appl. No. 12/174,020, filed Jul. 16, 2008.

Office Action (Mail Date Aug. 19, 2009) for U.S. Appl. No. 12/170,464, filed Jul. 10, 2008.

* cited by examiner

POST LAST WIRING LEVEL INDUCTOR USING PATTERNED PLATE PROCESS

This application is a divisional application claiming priority to Ser. No. 11/161,217, filed Jul. 27, 2005, U.S. Pat. No. 7,410,894 issued Aug. 12, 2008.

BACKGROUND OF THE INVENTION

1. Technical Field

The present invention relates generally to the field of semiconductor processing, and more particularly, to a method of forming an inductor above the last metal wiring level, and the structure so formed.

2. Related Art

Conventionally inductors are fabricated within metal wiring levels of a semiconductor device. This type of fabrication requires at least two levels of thick conductive wire and two levels of vias, necessitating the use of at least four masking steps. As a result, conventional inductor fabrication creates high production costs. In addition, conventional inductor fabrication produces inductors that tend to have high parasitic capacitance due to the close proximity of the inductor to the substrate. Finally, the large physical dimensions (height/width) needed to increase inductor quality factor can be incompatible with standard small dimension on chip wires and vias.

Therefore, there is a need in the industry for a method of forming an inductor that solves these and other problems.

SUMMARY OF THE INVENTION

The present invention provides a method of forming semiconductor structures, and the structures so formed, that solve the above-stated and other problems.

A first aspect of the invention provides a method of forming a semiconductor device, comprising: providing a substrate having a last metal wiring level within the substrate; depositing an insulative layer on the surface of the substrate; forming an inductor within the insulative layer on a planar level above the last metal wiring level; and forming an electrical interconnection within the insulative layer, wherein at least a portion of the electrical interconnection is coplanar with the inductor.

A second aspect of the invention provides a method of forming a semiconductor device, comprising: providing a substrate having a last metal wiring level within the substrate; depositing a first insulative layer on the surface of the substrate; forming an electrical interconnection within the first insulative layer; depositing a second insulative layer over the first insulative layer and the electrical interconnection; and forming an inductor within the second insulative layer on a planar level above the last metal wiring level.

A third aspect of the invention provides a method of forming a semiconductor device, comprising: providing a substrate having a last metal wiring level within the substrate; depositing a first insulative layer on the surface of the substrate; forming a portion of an electrical interconnection within the first insulative layer; depositing a second insulative layer over the first insulative layer; forming an inductor within the second insulative layer on a planar level above the last metal wiring level; and forming a remaining portion of the electrical interconnection within the second insulative layer.

A fourth aspect of the invention provides a semiconductor structure, comprising: a substrate having a last metal wiring level within the substrate; an insulative layer on a surface of the substrate; and an inductor within the insulative layer on a planar level above the last metal wiring level.

The foregoing and other features and advantages of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Although certain embodiments of the present invention will be shown and described in detail, it should be understood that various changes and modifications might be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1:
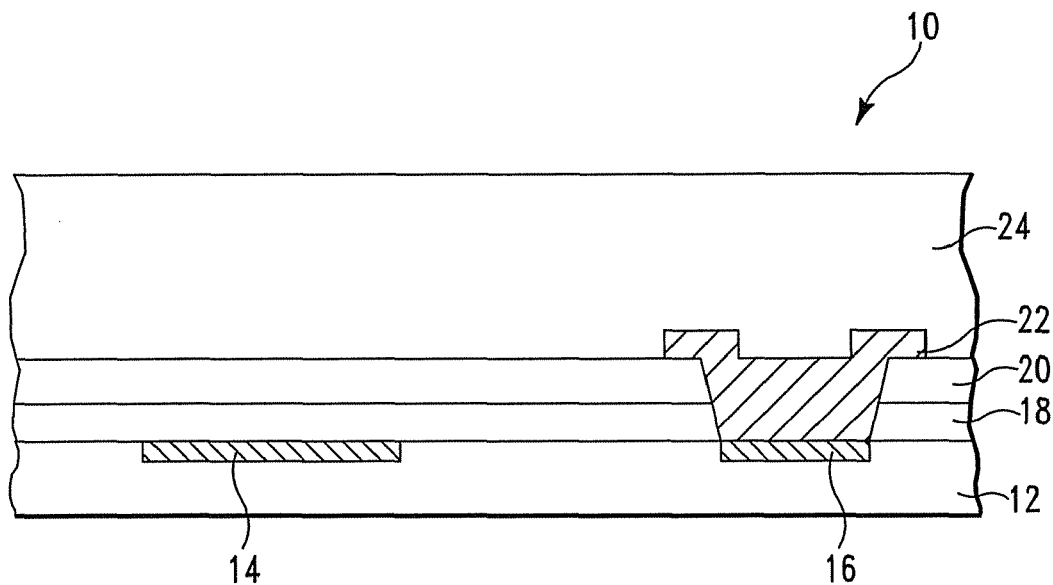
FIG. 1 depicts a cross-sectional view of a semiconductor structure comprising an insulative layer formed over a last metal wiring level, having an electrical interconnection, in accordance with a first embodiment of the present invention.

In accordance with a first embodiment, FIG. 1 depicts a cross-sectional view of a structure 10 comprising at least a portion of a substrate 12, wherein the substrate 12 may comprise silicon or other similarly used material. The substrate 12 further includes at least a first 14 and a second 16 conductive element therein, wherein the conductive elements 14, 16 comprise conductive wires within a last metal wiring level of the structure 10. Wires 14 and 16 are preferably fabricated using a damascene copper process, as known in the art, but could be fabricated using any known method, including damascene and subtractive etch, and any conductor.

The structure 10 further includes a capping dielectric layer 18 deposited over the surface of the last metal wiring level of the substrate 12. The capping layer 18 prevents the copper within the wires 14, 16 from diffusing into the remaining portion of the structure 10 formed above the wires 14, 16. The capping layer 18 may comprise one or more of layers of 'SiN', 'SiC', 'SiCN', etc., deposited using methods known in the art such as plasma enhanced vapor deposition (PECVD). By 'SiN', 'SiC', or 'SiCN', we are referring to dielectrics which would also contain impurities, such as H, and would likely not have atomic ratios of 1:1 (e.g., a 'SiN' film could consist of $Si_3N_4H_2$). Prior to depositing the capping layer 18, a surface clean, such as a 10 second $NH_3$ or $H_2$ plasma may be performed. The structure 10 further includes an insulative layer 20, comprising a dielectric, such as SiCOH or $SiO_2$, etc., deposited over the capping layer 18. An electrical interconnection, such as a wire bond or soldier bump pad 22 is formed within the insulative layer 20 and the capping layer 18, over and electrically contacting the second wire 16 within the last metal wiring level of the structure 10, as known in the art. A layer of photoresist 24 is applied over the wire bond pad 22 and the insulative layer 20. The layer of photoresist 24 may have a thickness in the range of 5-30 μm, e.g., 10 μm, and can either be applied using spin-on or tape processes, as known in the art.

Figure 2:
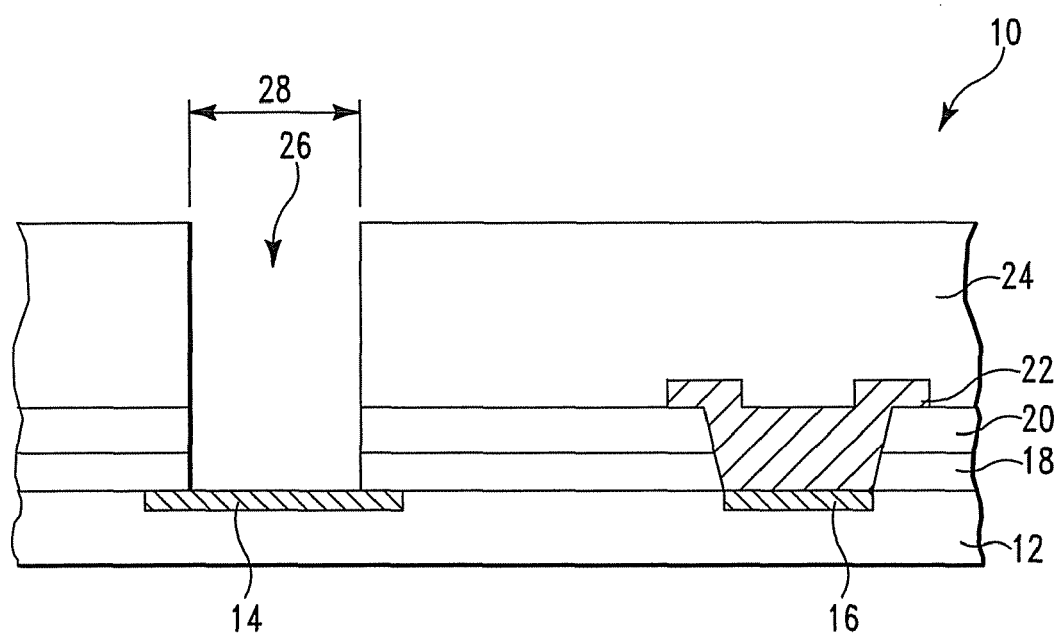
FIG. 2 depicts the structure of FIG. 1 having an opening formed within the insulative layer.
Figure 3:
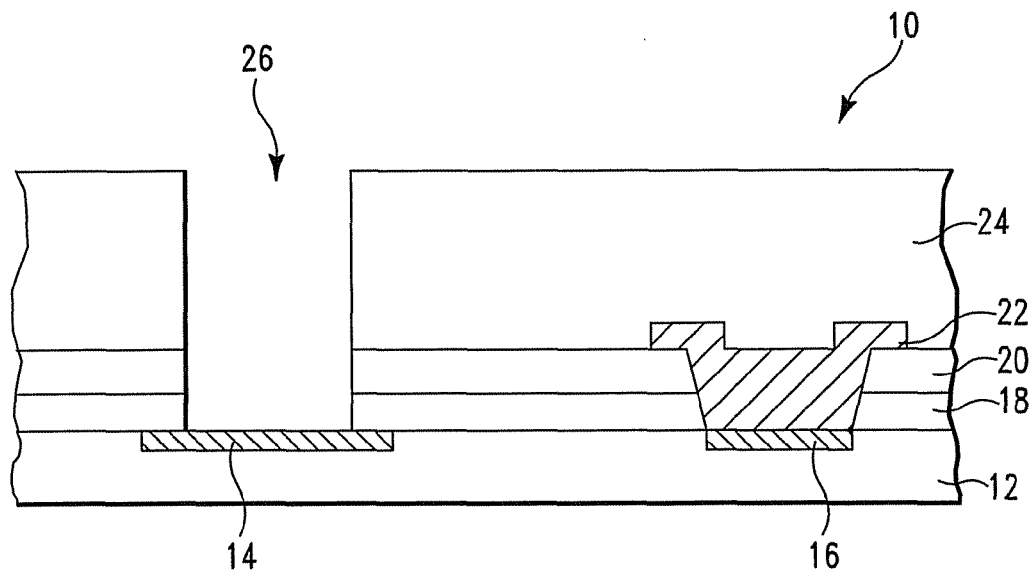
FIG. 3 depicts the structure of FIG. 2 wherein the opening extends down to the last metal wiring level.

As illustrated in FIG. 2, at least one feature opening or via 26 is formed within the layer of photoresist 24, down to the insulative layer 20, above the first wire 14 of the last metal wiring level. The via 26 may be formed having a width 28 in the range of about 10-50 μm, e.g., 20 μm. A reactive ion etch (RIE) or wet chemical etch process is performed down to the surface of the wire 14 to remove the insulative layer 20 and the capping layer 18 from within the via 26, as shown in FIG. 3. Any RIE or wet chemical etch could be used, as known in the art, such as a parallel plate etch at 100 mT using gases such as perfluorocarbons (PFC), oxygen. CO, Ar, etc., as known in the art.

Figure 4:
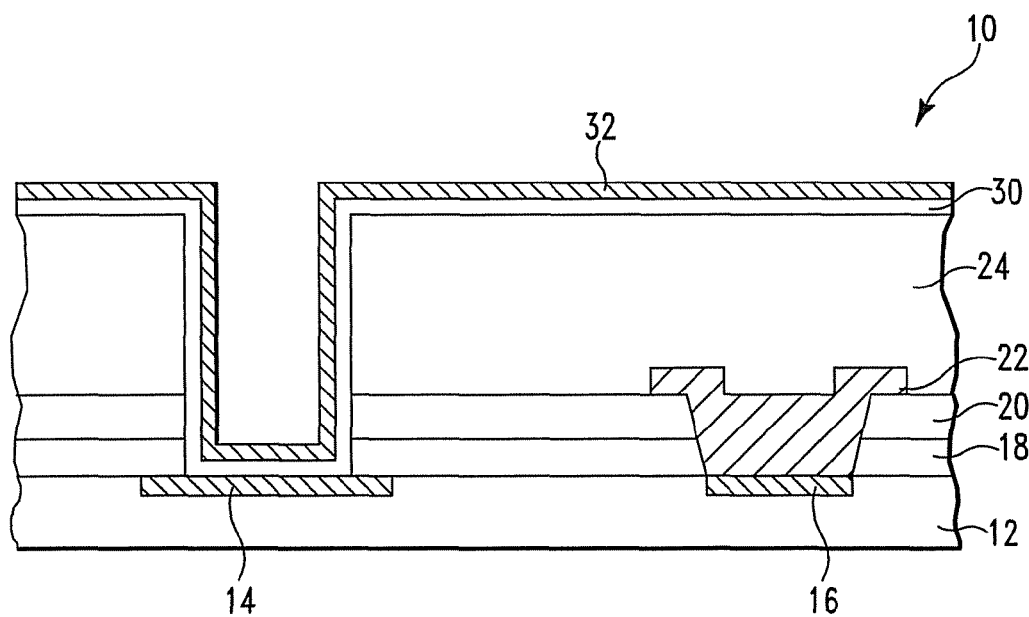
FIGS. 4-7 depict a patterned plate process used in the formation of an inductor.

A "patterned plate" process, illustrated in FIGS. 4-7, is then performed to fabricate the conductive portion of a transmission line. "Patterned plate" process as used herein refers to the plating process used to form an electrically conductive feature or transmission line within a via and/or wire trench, wherein the via has an opening diameter in the range of about 1-1000 micron. As illustrated in FIG. 4, the patterned plate process begins with the deposition of a liner 30. The liner 30 may be deposited over the surface of the structure 10 using sputtering, or other similarly used techniques as known in the art, having a thickness in the range of about 10-500 nm, e.g., 50 nm. The liner 30 may comprise one or more layers of Ta, TaN, TaSiN, Ru, etc. A seed layer 32 is then sputter deposited over the liner 30, as also shown in FIG. 4. The seed layer 32 may comprise Cu, or other similarly used material, and may have a thickness in the range of about 50-1000 nm, e.g., 150 nm.

Figure 5:
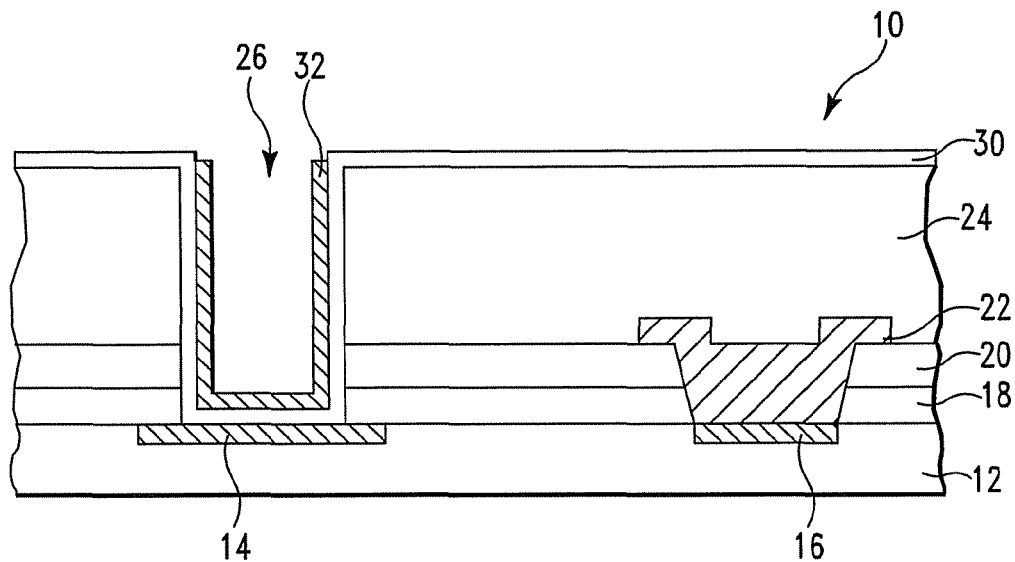

As illustrated in FIG. 5, the excess seed layer 32 on the surface of the substrate 12 is removed using a chemical mechanical polish (CMP), e.g., a stiff pad, such as a Rodel Corporation IC1000™ pad, copper CMP if the seed layer 32 comprises copper, or other similarly used technique. A standard brush clean, preferably clustered to the CMP tool, is then performed followed by a standard wet chemical clean, such as 100:1 DHF acid, to remove slurry from the via 26. Removing the excess seed layer 32 on the surface of the substrate 12, leaving the seed layer 32 within the opening 26, prevents deposition of the conductive material in the next step from plating in undesired areas. It should also be noted that the rather low aspect ratio, (aspect ratio=width/height), e.g., <1, via 26 diameter allows for easier removal of the slurry during this step.

Figure 6:
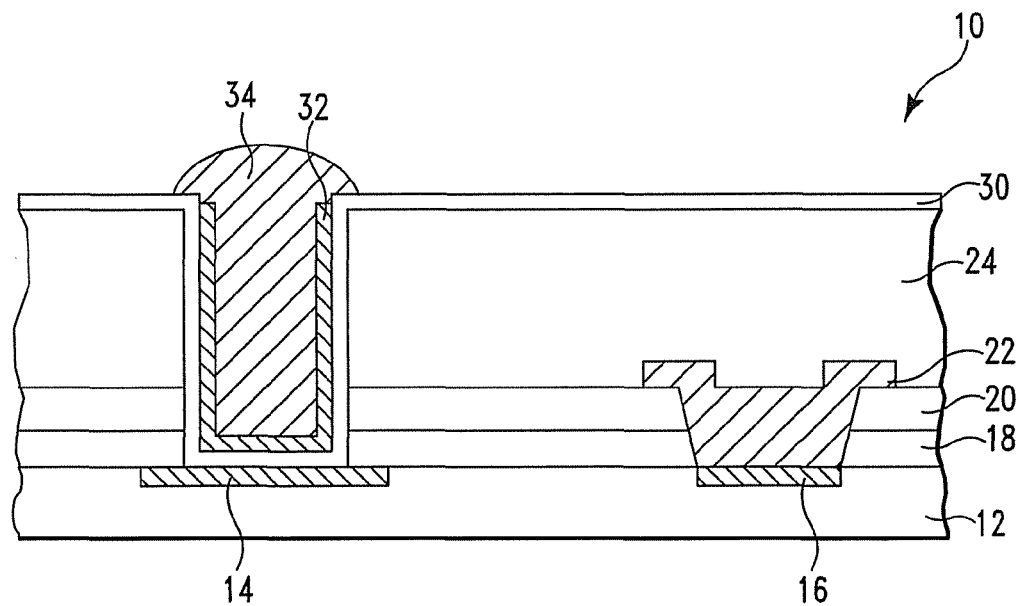
Figure 7:
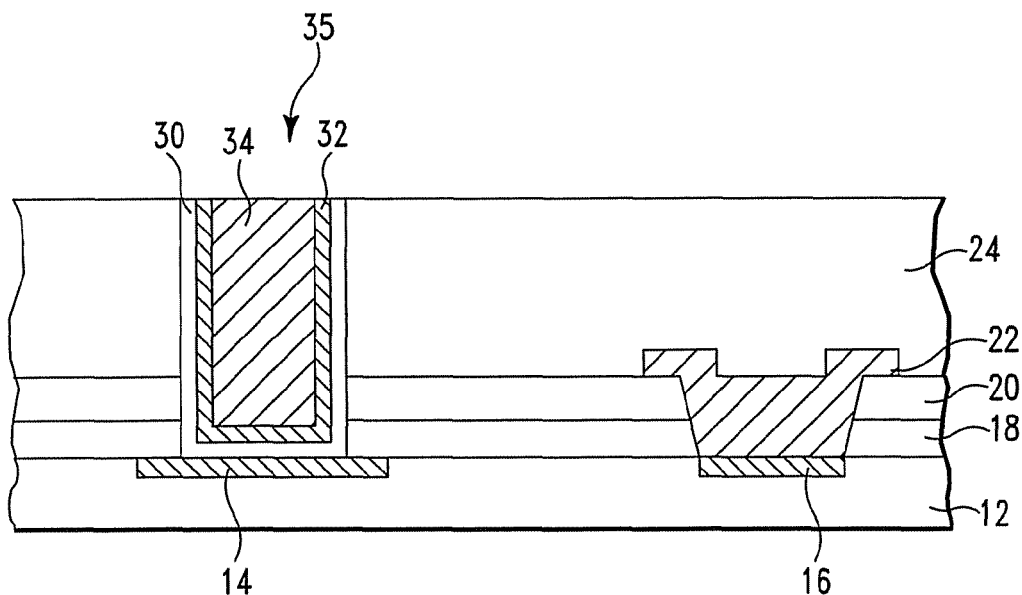

As illustrated in FIG. 6, a conductive material 34 is deposited within the via 26 of the structure 10. The conductive material 34, e.g., copper, is deposited using electro-plating copper deposition (ECD), assuming the seed layer 32 preferably comprises copper seed or a conductive seed layer compatible with Cu electroplating, such as aluminum. As shown, the conductive material 34 may be deposited having a non-planar exposed surface. To complete the patterned plate process, a CMP or other similar process, such as an etchback process, may then be performed to remove the excess conductive material 34 extending above the surface of the structure 10, as well as the excess liner 30 on the surface of the structure 10, to form a transmission line, such as an inductor 35, as illustrated in FIG. 7. If CMP is used, then a brief Cu CMP would be needed first if the Cu conductive material 34 extends above the surface of the liner 30 followed by a liner CMP process to remove the liner 30.

Figure 8:
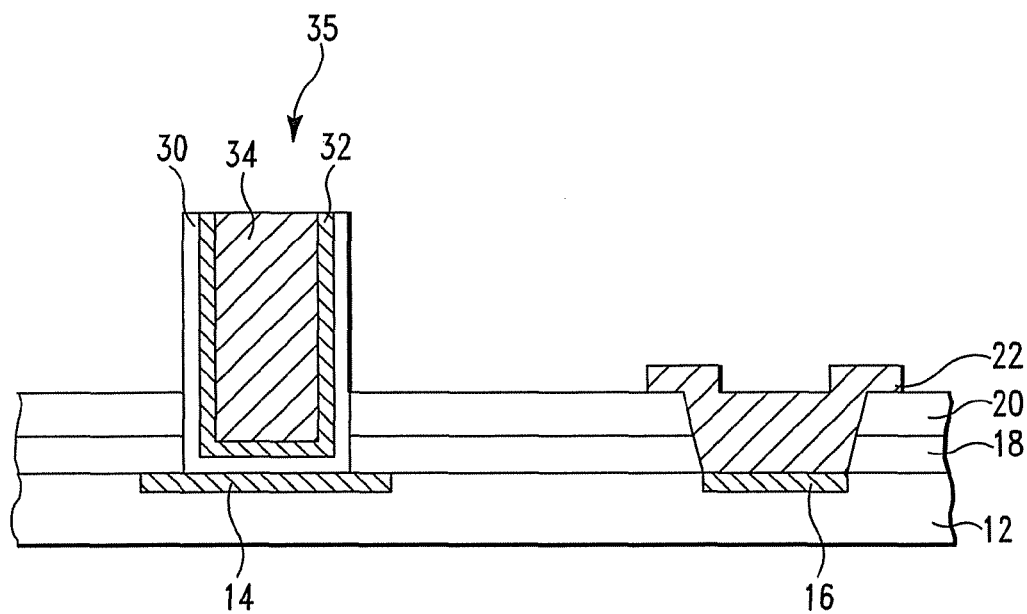
FIG. 8 depicts the structure of FIG. 7 having a photoresist layer removed.

A wet or dry photoresist strip process is then performed to remove the layer of photoresist 24, as shown in FIG. 8. Suitable dry strip processes include downstream or plasma strip chambers using reducing ambients, such as one or more of nitrogen, hydrogen, ammonia, etc., such that the copper wires are not oxidized or corroded. Wet chemical resist strips, such as NMP or others known in the art could also be employed. A wafer clean, such as diluted hydrofluoric acid (DHF) or a commercially available clean compatible with Cu, is then optionally performed to remove debris created during the resist strip. Following the removal of the photoresist 24, the inductor 35 and wire bond pad 22 are exposed.

Figure 9:
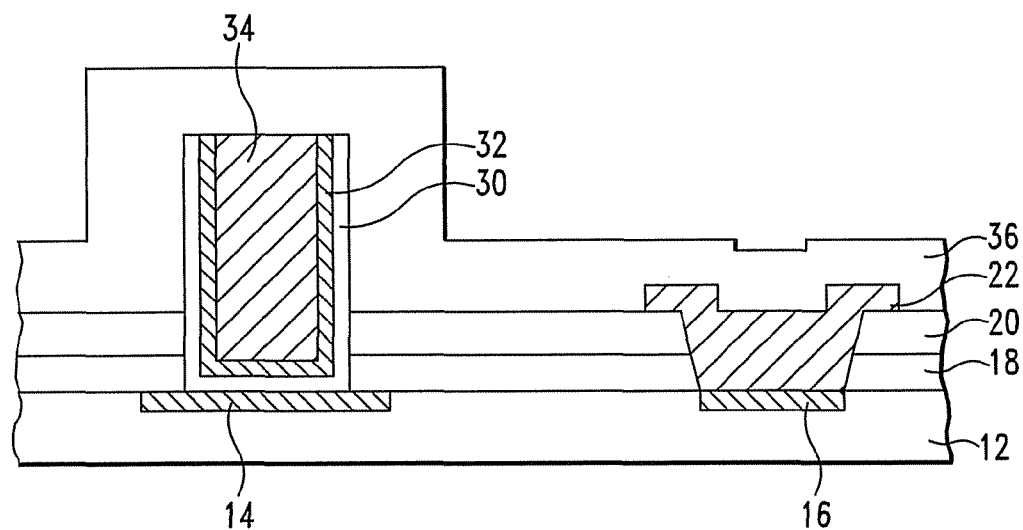
FIG. 9 depicts the structure of FIG. 8 having a dielectric layer formed over the surface of the structure.

A conformal dielectric layer 36 is deposited over the surface of the structure 10, as illustrated in FIG. 9. The dielectric layer 36 may comprise a layer of SiN, a layer of $SiO_2$, a second layer of SiN and a layer of polyimide, (individual layers of the dielectric 36 are not shown for purposes of simplicity), and have a total thickness in the range of about 3-30 μm, e.g., 10 μm. The SiN and $SiO_2$ layers of the dielectric 36 may be formed using plasma CVD, or other similar technique, while the polyimide would be spin-applied as known in the art. Alternatively, the polyimide could be replace by any polymeric passivation film, such as BCB™.

Figure 10:
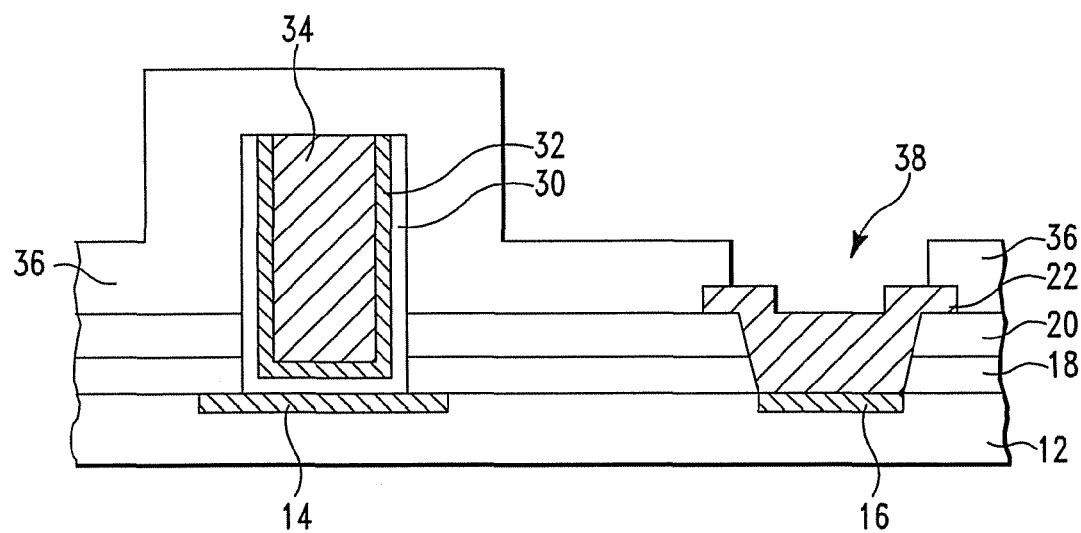
FIG. 10 depicts the structure of FIG. 9 having an opening formed within the dielectric layer to expose the electrical interconnection.

As illustrated in FIG. 10, a pad via lithography step, followed by a RIE is performed to create an opening 38 in the dielectric 36 above the wire bond pad 22, thereby exposing the wire bond pad 22 for electrical connection, as known in the art. Alternatively a soldier bump could be formed over pad 22, as known in the art.

Figure 11:
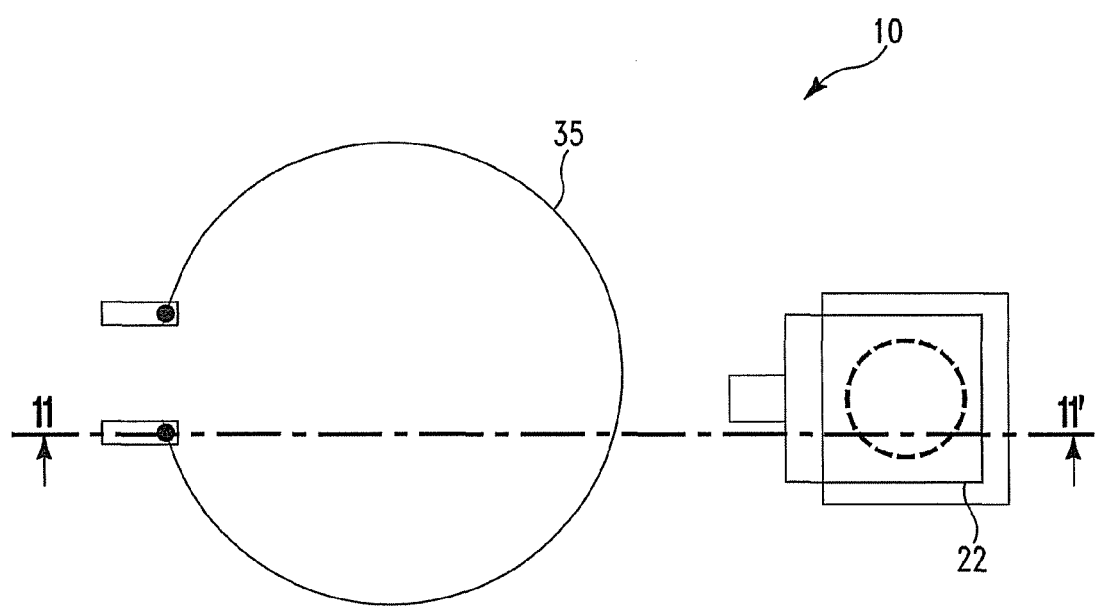
FIG. 11 depicts a top view of the structure of FIG. 10.

FIG. 11 shows a top view of the structure 10 of FIG. 10. The structure 10 is a spiral planer type of inductor 35, as known in the art.

Figure 12:
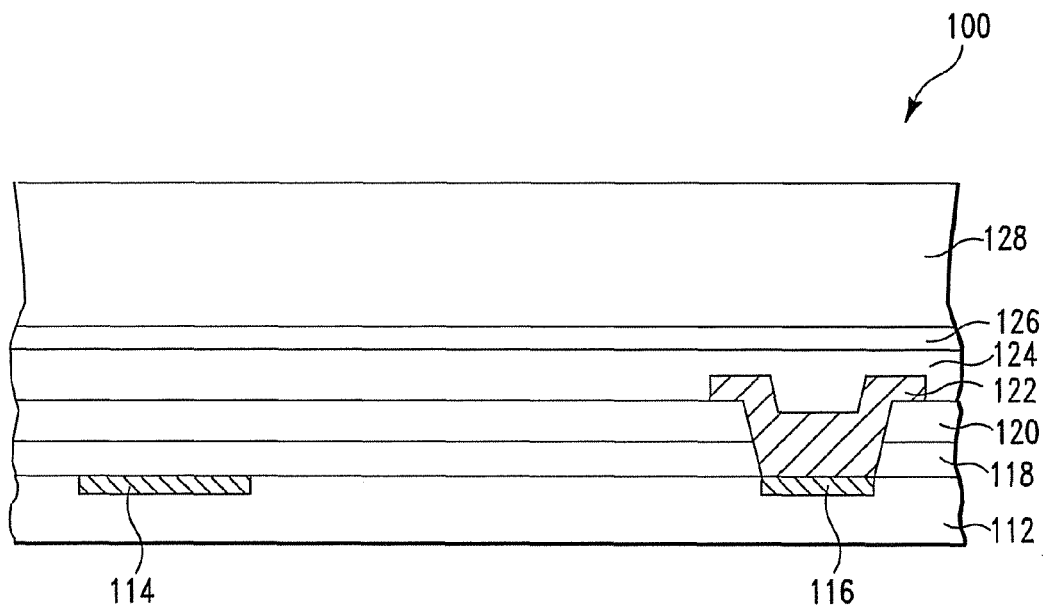
FIG. 12 depicts a cross-sectional view of a semiconductor structure, comprising a plurality of insulative layers formed over a last metal wiring level, and an electrical interconnection formed therein, in accordance with a second embodiment of the present invention.

In accordance with a second embodiment, FIG. 12 depicts a structure 100 similar to the structure 10 shown in FIG. 1 including at least a portion of a substrate 112 comprising silicon or other similarly used material. The substrate 112 further includes at least a first 114 and a second 116 conductive element therein, wherein the conductive elements 114, 116 comprise wires, consisting of a conductor such as copper, within a last metal wiring level of the structure 100. The structure 100 further includes a capping layer 118 deposited over the surface of the last metal wiring level of the substrate 112. The capping layer 118 may comprise SiN, SiC, SiCN, etc. as discussed supra. The structure 100 further includes an insulative layer 120, such as $SiO_2$, SiN, etc., deposited over the capping layer 118 preferably a single layer of $SiO_2$ having a thickness in the range of about 0.5-5 μm, e.g., 1 μm. The structure 100 also includes an electrical interconnection, such as a wire bond or soldier bump pad 122, formed over and electrically contacting the second wire 116 within the last metal wiring level of the structure 100.

A first layer of photo-imagable material, such as uncured photo-sensitive polyimide (PSPI) 124 is formed over the surface of the structure 100. Other photo-imagable materials, such as photoresist, could also be employed. The first layer of PSPI 124 may be formed using spin-on methods as known in the art, or other similarly used technique, to a thickness in the range of about 3-20 μm, e.g., 5 μm. A layer of low temperature oxide 126 may then be deposited over the first layer of PSPI 124 using PECVD, spin-on, or other similarly used technique. The layer of low temperature oxide 126 may be deposited having a thickness in the range of about 0.05-1 μm, e.g., 0.1 μm. It should be noted that "low temperature" as used herein refers to a temperature which will not degrade the first layer of PSPI 124, i.e., in the range of about 25-350° C., e.g., 150-200° C. A second layer of photo-imagable material, such as PSPI 128 may then be deposited, using spin-on methods as known in the art, over the layer of low temperature oxide 126. As with the first layer of PSPI 124, photoresist could also be used. The second layer of PSPI 128 may be formed having a thickness in the range of about 3-20 μm, e.g., 8 μm.

Figure 13:
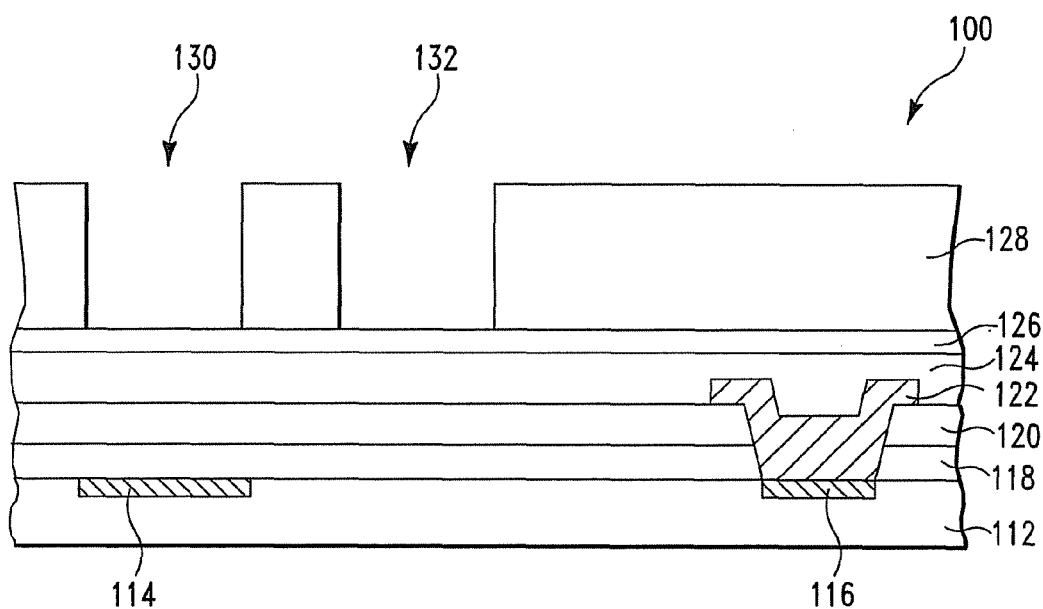
FIG. 13 depicts the structure of FIG. 12 having a pair of openings formed within a photoresist layer.

As illustrated in FIG. 13, the second layer of PSPI 128 is lithographically patterned and developed to form at least one opening. In this example, two of the openings are shown in this cross-sectional view, a first opening 130 above the first copper wire 114 within the last metal wiring level, and a second opening 132.

Figure 14:
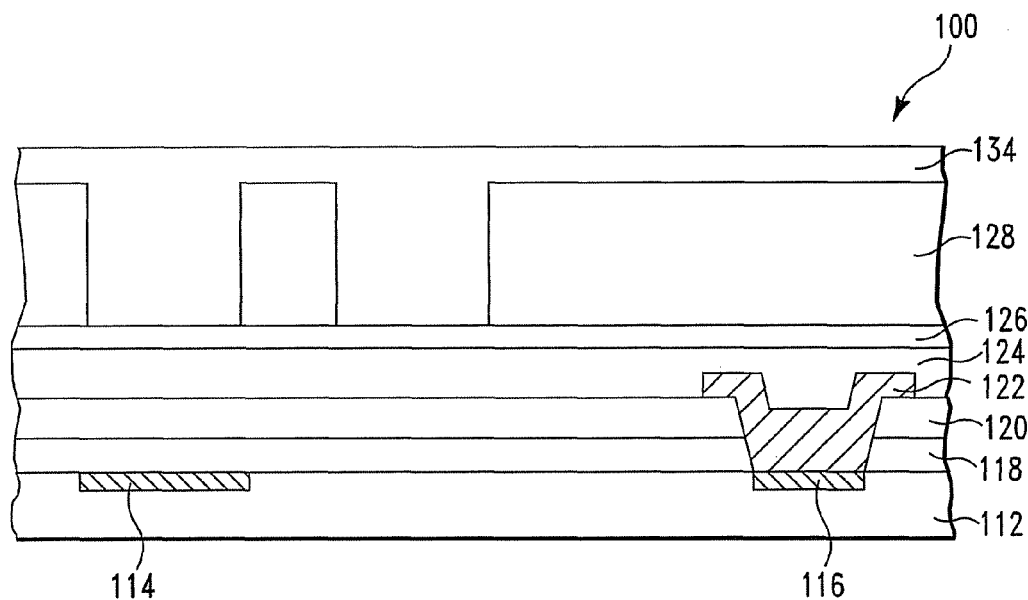
FIG. 14 depicts the structure of FIG. 13 having a dielectric layer formed over the surface of the structure.
Figure 15:
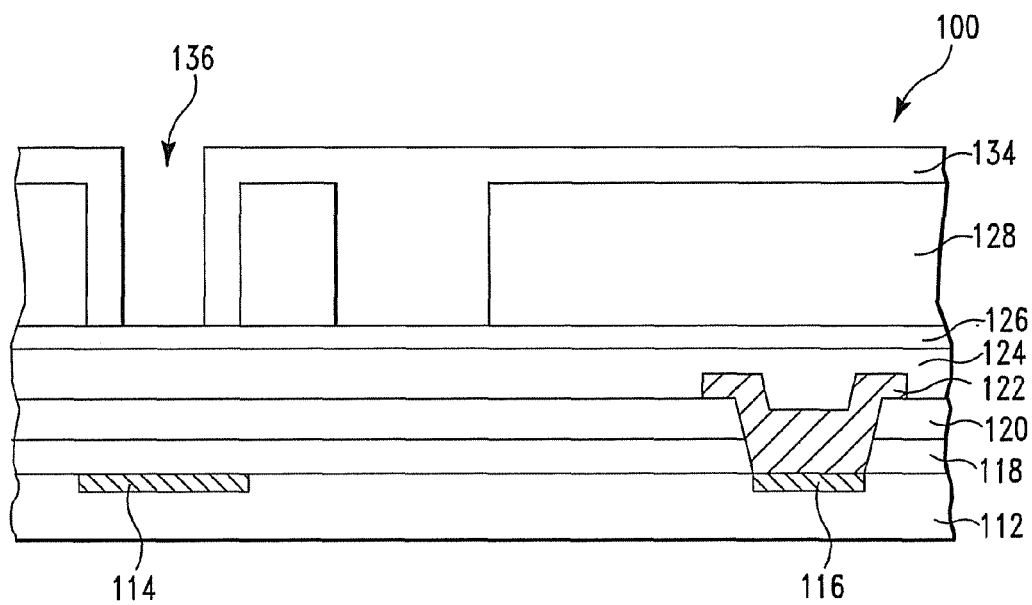
FIG. 15 depicts the structure of FIG. 14 having an opening formed within the dielectric layer.
Figure 16:
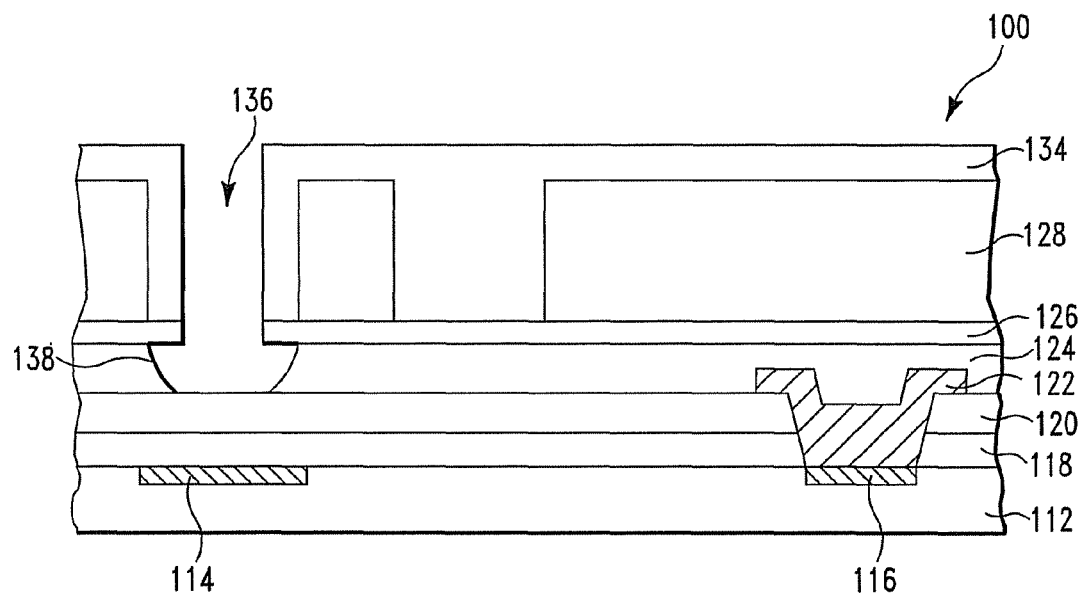
FIG. 16 depicts the structure of FIG. 15 having an opening formed within the insulative layers.

A layer of photoresist 134, having a thickness in the range of about 3-10 mm thick, e.g., 5 μm, is applied over the surface of the substrate 112, as illustrated in FIG. 14. After the photoresist 134 is imaged with a via opening, as illustrated in FIG. 15, a dielectric RIE or wet etch, is performed to form an opening 136 in the layer of low temperature oxide 126 in the region above the first copper wire 114. Subsequently, the first layer of PSPI 124 beneath the opening 136 is then etched such that an isotropic undercut profile 138 is formed within the first layer of PSPI 124, as shown in FIG. 16.

Figure 17:
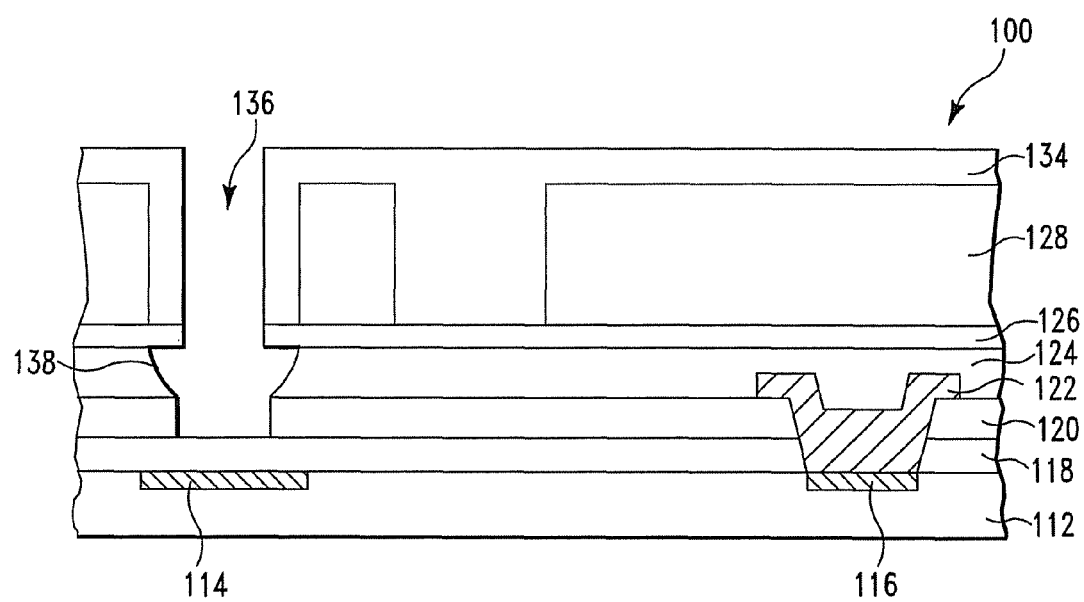
FIG. 17 depicts the structure of FIG. 16 wherein the opening extends down to the last metal wiring level.

As illustrated in FIG. 17, the insulative layer 120 is then etched beneath the opening 136 using a reactive ion etch (RIE), or other similar process, stopping on the Cu capping layer 118 above the first copper wire 114 within the last metal wiring level.

Figure 18:
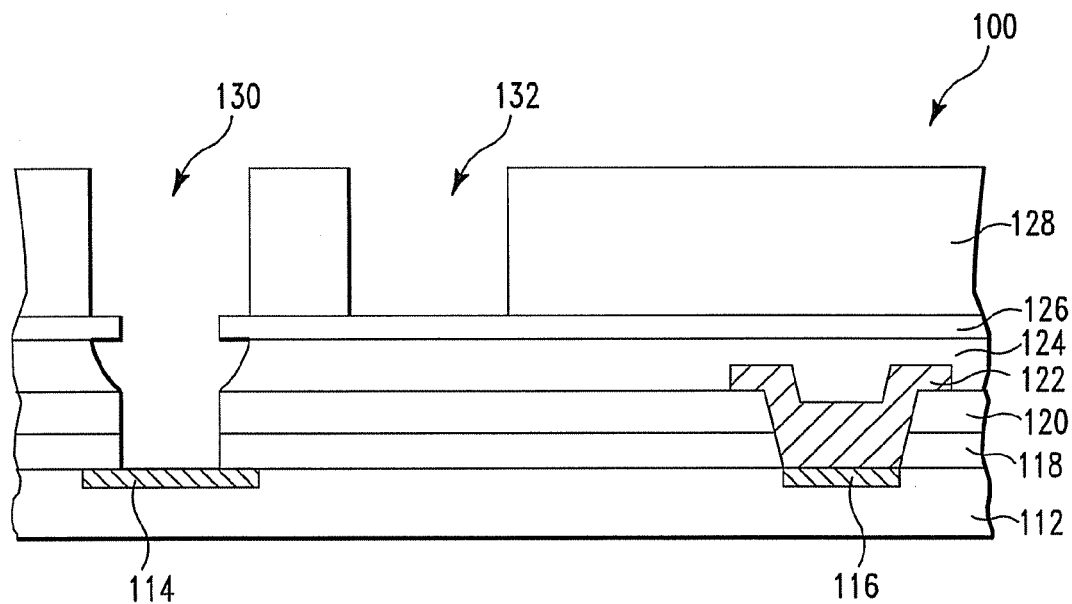
FIG. 18 depicts the structure of FIG. 17 following removal of the dielectric layer.
Figure 19:
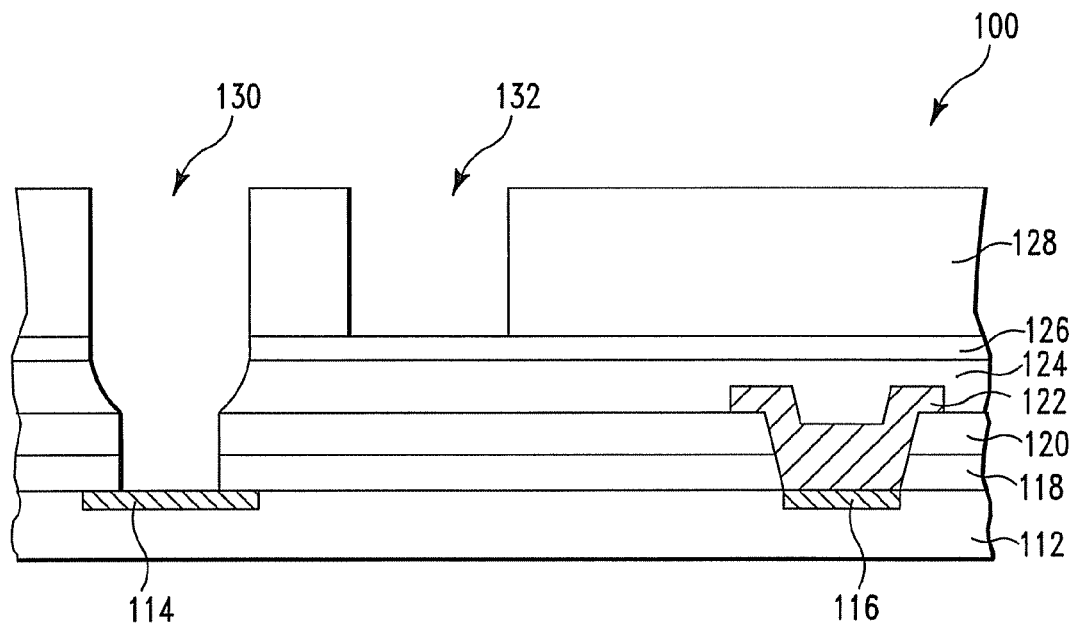
FIG. 19 depicts the structure of FIG. 18 having the portion of insulative layer removed from within the opening.

As shown in FIG. 18, the photoresist 134 is removed using a standard wet chemical or plasma strip processes. A wet etch, such as 100:1 dilute HF acid (DHF), is then performed to remove the excess low temperature oxide 126 extending within the first opening 130, as illustrated in FIG. 19. Since the low temperature oxide 126 is deposited at ~200° C., it will have a much higher etch rate in DHF acid than thermal oxide. Finally, Cu capping layer 118 is removed using a standard RIE or wet etch processes, exposing Cu wire 114.

Figure 20:
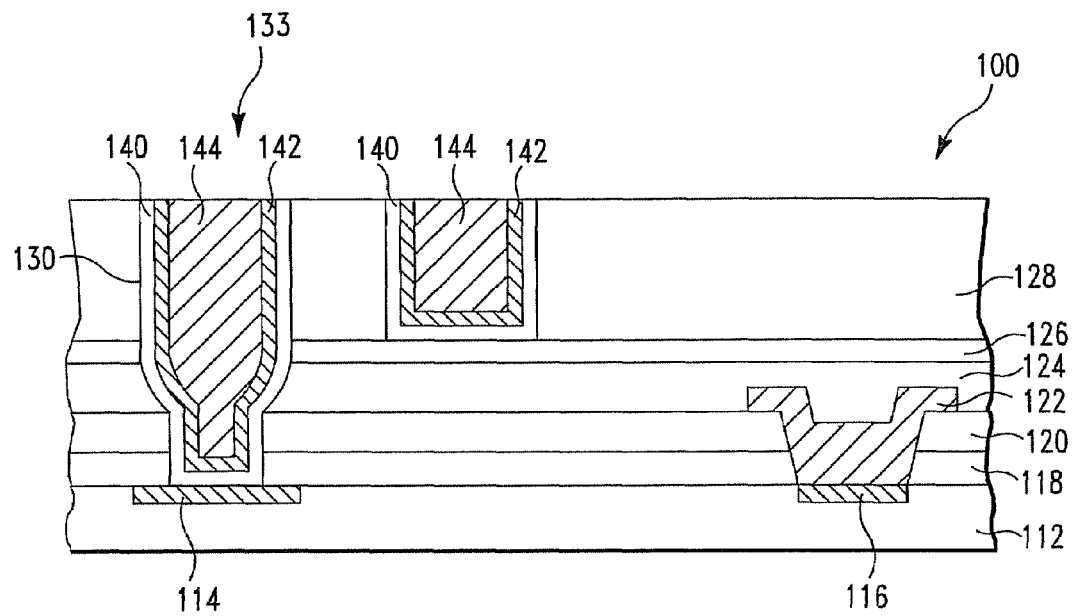
FIG. 20 depicts the structure of FIG. 19 following a patterned plate process.

As illustrated in FIG. 20, the patterned plate process described and illustrated in FIGS. 4-7 of the first embodiment, is used to form a liner 140, a seed layer 142 and a conductive material 144 within the first and second openings 130, 132, thereby forming a transmission line, or in this example, an inductor 133.

Figure 21:
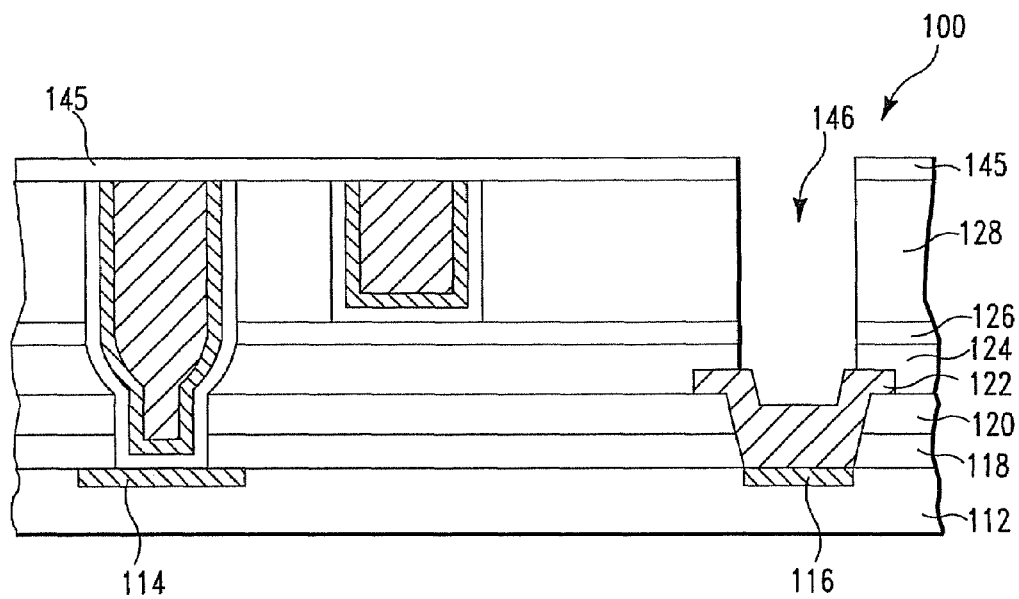
FIG. 21 depicts the structure of FIG. 20 having an opening formed within the structure to expose the electrical interconnection.

After a Cu capping dielectric layer 145 is deposited, similar to layer 118, a mask (not shown) is used to remove the first and second layers of PSPI 124, 128 and the low temperature oxide 126, forming an opening 146 to expose the wire bond pad 122, as shown in FIG. 21. Alternatively, an electroless plating process, using CoWP or other known Cu capping metals, could be employed to cap the Cu wires 144 and 142, as known in the art.

The structure 100 is a spiral inductor 133 having a top view similar to the one shown in FIG. 11.

Figure 22:
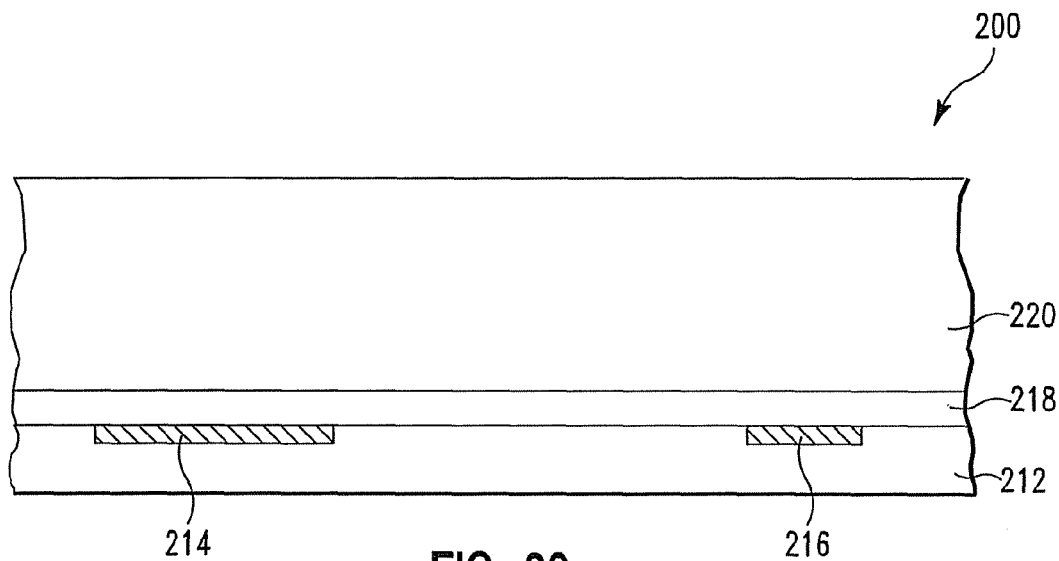
FIG. 22 depicts a cross-sectional view of a semiconductor structure comprising a first and second insulative layer formed over a last metal wiring level, in accordance with a third embodiment of the present invention.

In accordance with a third embodiment, FIG. 22 depicts a structure 200 comprising a substrate 212 including at least one conductive wire within a last metal wiring level, in this example, a first 214 and a second wire 216 are shown within the last metal wiring level. The structure 200 further includes a capping layer 218 deposited over the surface of the last metal wiring level of the substrate 212. The capping layer 218 may comprise SiN, SiC, SiCN, etc., as described supra. A layer of photo-imagable material, such as PSPI 220 may be deposited over the capping layer 218 using PECVD deposition. The PSPI 220 may be deposited having a thickness in the range of about 5-30 μm, e.g., 10 μm. Alternatively, as with the previous embodiments, the layer of PSPI 220 could consist of photoresist.

Figure 23:
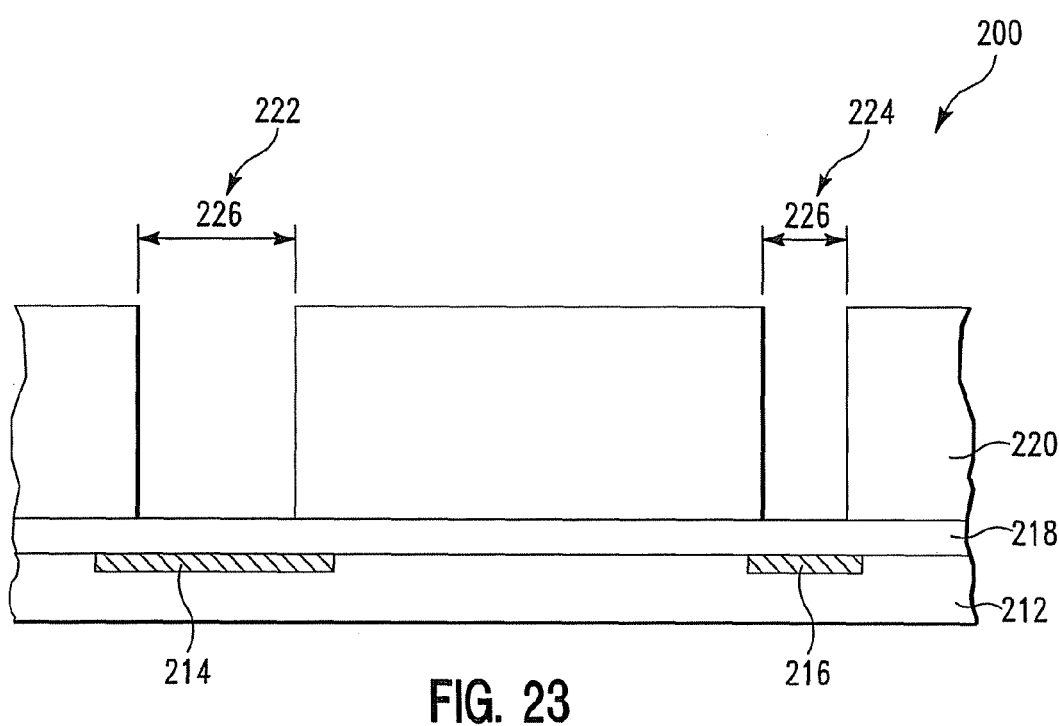
FIG. 23 depicts the structure of FIG. 22 having a pair of openings within a photoresist layer.

As illustrated in FIG. 23, the layer of PSPI 220 is patterned and developed to form a first 222 and second opening 224 in this cross-sectional view within the layer of PSPI 220 above the first and second wires 214, 216 of the last metal wiring level. The first and second openings 222, 224 are formed down to the capping layer 218 and have a width 226 in the range of about 3-30 μm, e.g., 5 μm.

Figure 24:
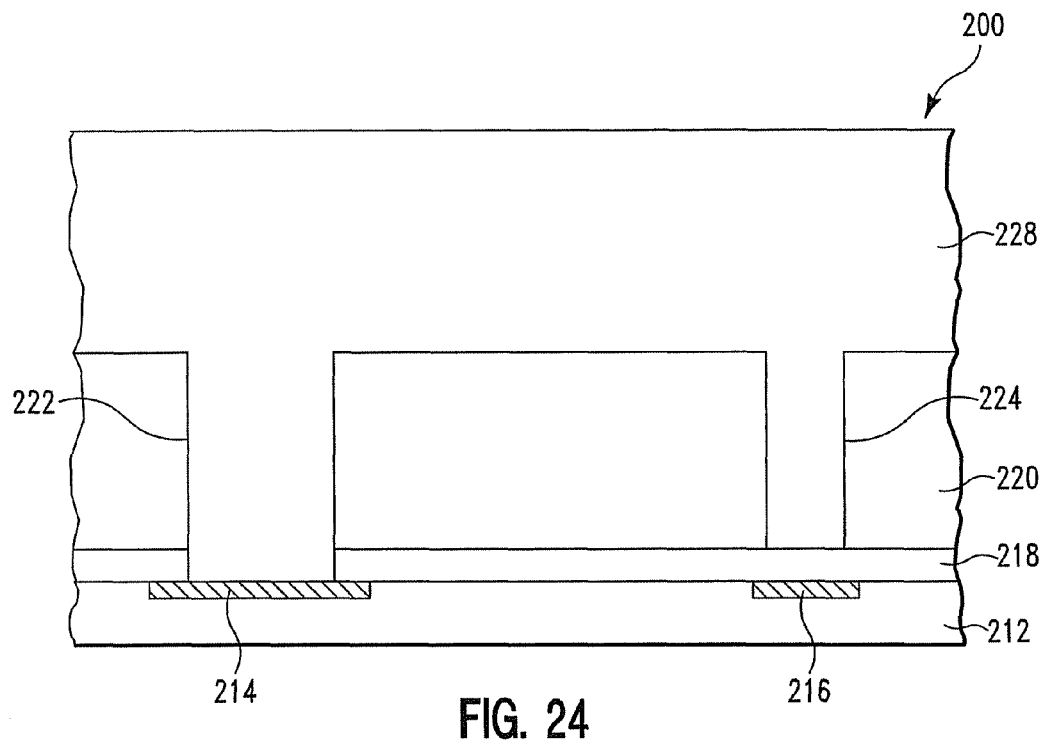
FIG. 24 depicts the structure of FIG. 23 having a second layer of photoresist deposited over the surface of the structure.
Figure 25:
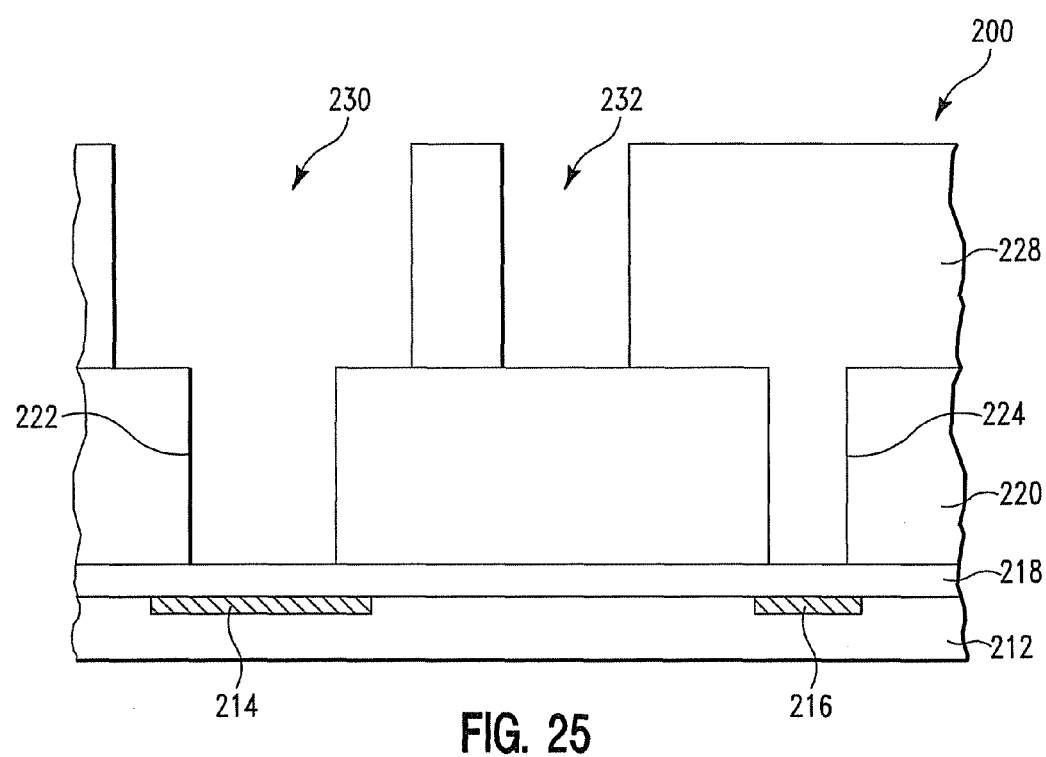
FIG. 25 depicts the structure of FIG. 24 having openings formed within the second layer of photoresist.

A second layer of photoresist 228 is then applied over the surface of the structure 200 filling the first and second openings 222, 224 within the PSPI 220, as shown in FIG. 24. The second layer of photoresist 228 is then lithographically patterned and developed down to the surface of the PSPI 220 to form a third opening 230 and a fourth opening 232 which are within the second layer of photoresist 228, as shown in FIG. 25. The third opening 230 within the second layer of photoresist 228 connects to the first opening 222 within the PSPI 220 to form a dual damascene feature.

Figure 26:
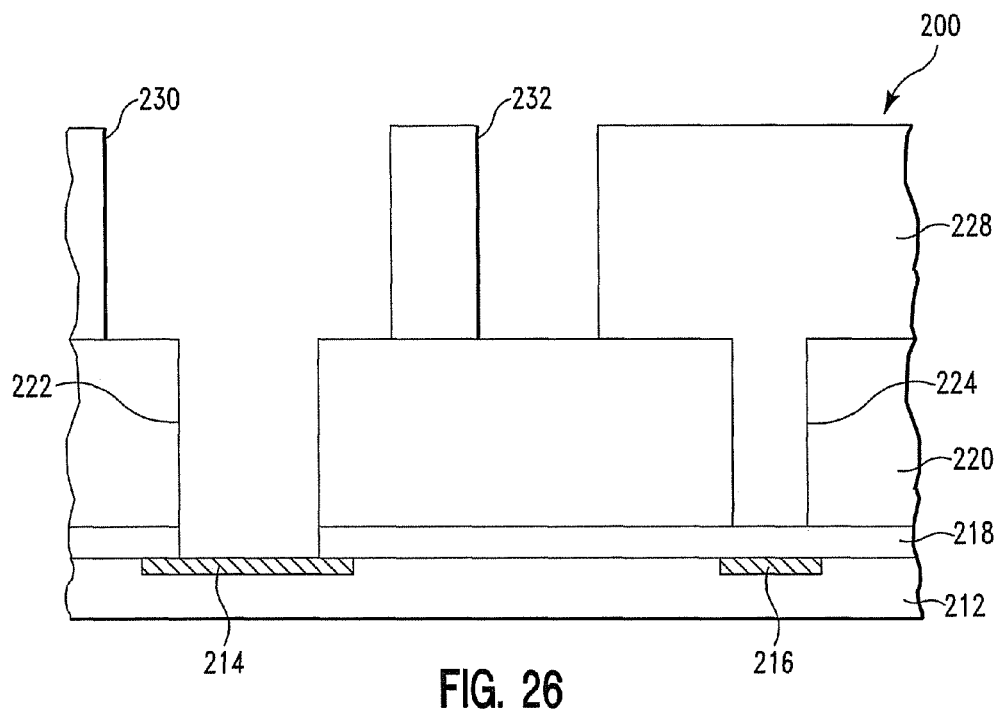
FIG. 26 depicts the structure of FIG. 25 wherein the capping layer is removed from within the opening.

An etch is performed, e.g., a nitride etch if the capping layer 218 comprises nitride, to remove the capping layer 218 from the first opening 222 in the PSPI 220, as shown in FIG. 26. A DHF or similar clean, as known in the art, is performed to remove excess debris created during the etch.

Figure 27:
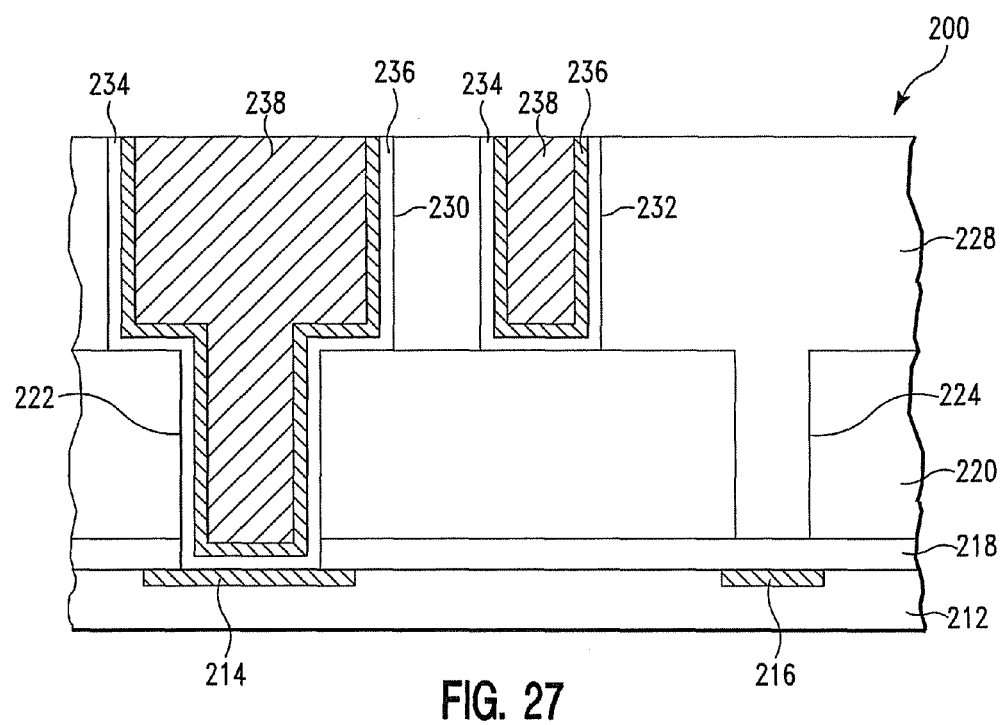
FIG. 27 depicts the structure of FIG. 26 following a patterned plate process.

As illustrated in FIG. 27, the patterned plate process, described and illustrated in FIGS. 4-7 of the first embodiment, is used to deposit a liner 234, a seed layer 236 and a conductive material 238 within the openings 222, 230, 232 to form a transmission line, or in this example, an inductor 233.

Figure 28:
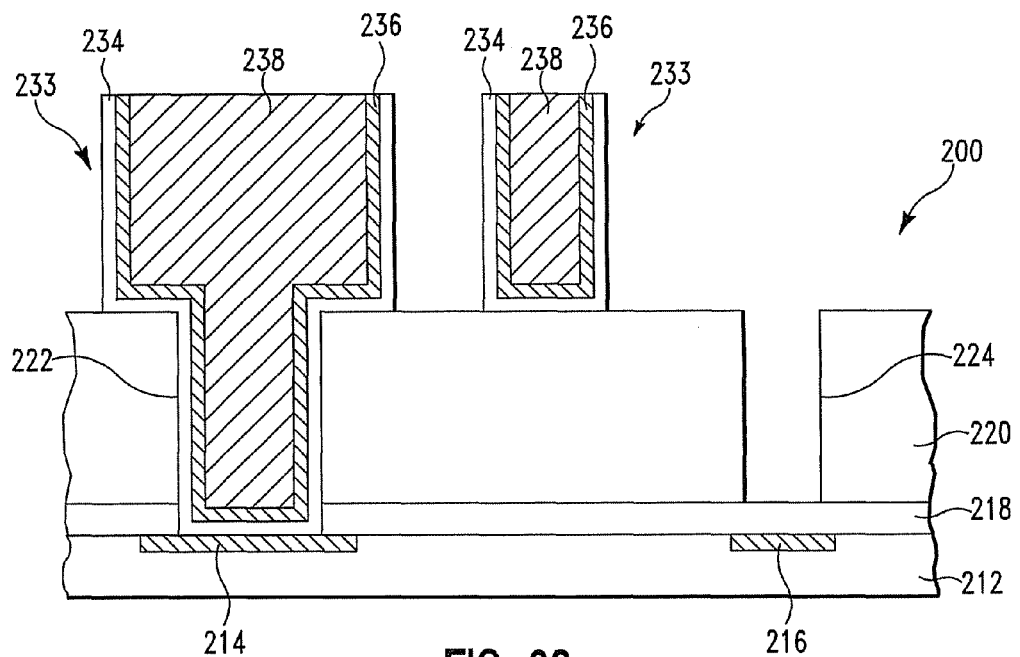
FIG. 28 depicts the structure of FIG. 27 following removal of the second layer of photoresist.

The second layer of photoresist 228 is removed, as shown in FIG. 28, using a resist strip, such as a solvent or non-oxidizing plasma etch, or a downstream RIE process. A DHF clean process is then performed to remove debris created during the resist strip. As with the previous embodiment, the Cu layers 230 and 238 are then capped with a dielectric or conductive diffusion barrier. If a dielectric diffusion barrier is used, then it should be thinner than the capping layer 218, e.g., ½ the thickness of the capping layer 218.

Figure 29:
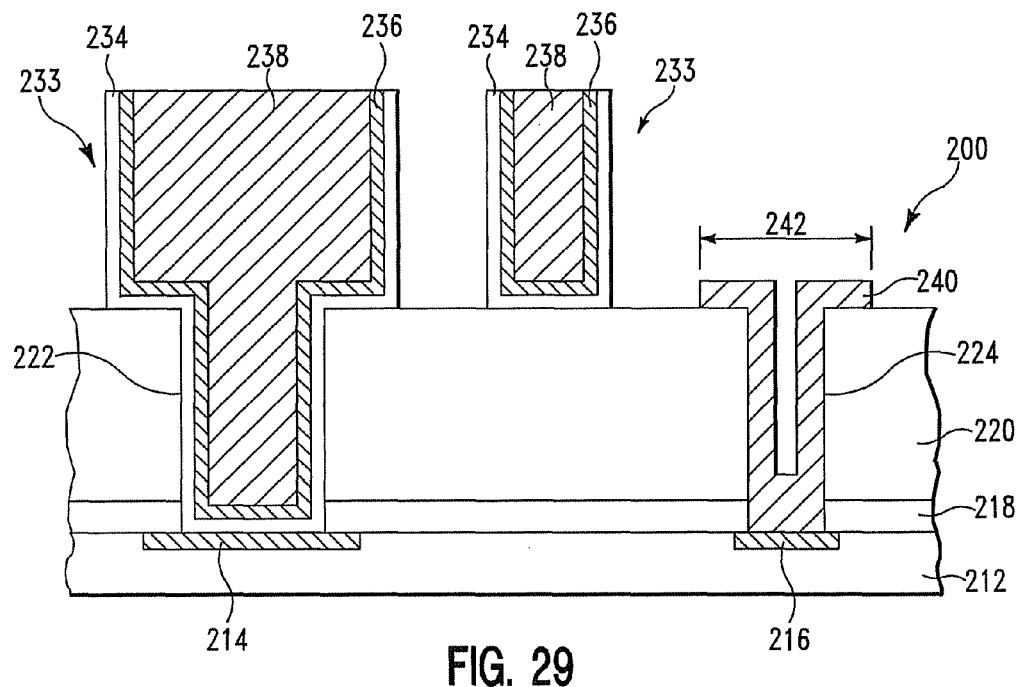
FIG. 29 depicts the structure of FIG. 28 following formation of an electrical interconnection.

An electrical interconnection, such as a wire bond or soldier bump pad 240, is then formed within the second opening 224 in the layer of PSPI 220, as illustrated in FIG. 29. First, an unpatterned RIE or wet etch is performed to remove the capping layer 218. If a dielectric Cu diffusion barrier was deposited over Cu layers 230 and 238, as discussed above, then a portion of the diffusion barrier would also be removed. The wire bond pad 240 may be formed having a width 242 in the range of about 50-500 μm, e.g., 100 μm wide.

The structure 200 is a spiral inductor 233 having a top view similar to the one shown in FIG. 11.

Figure 30:
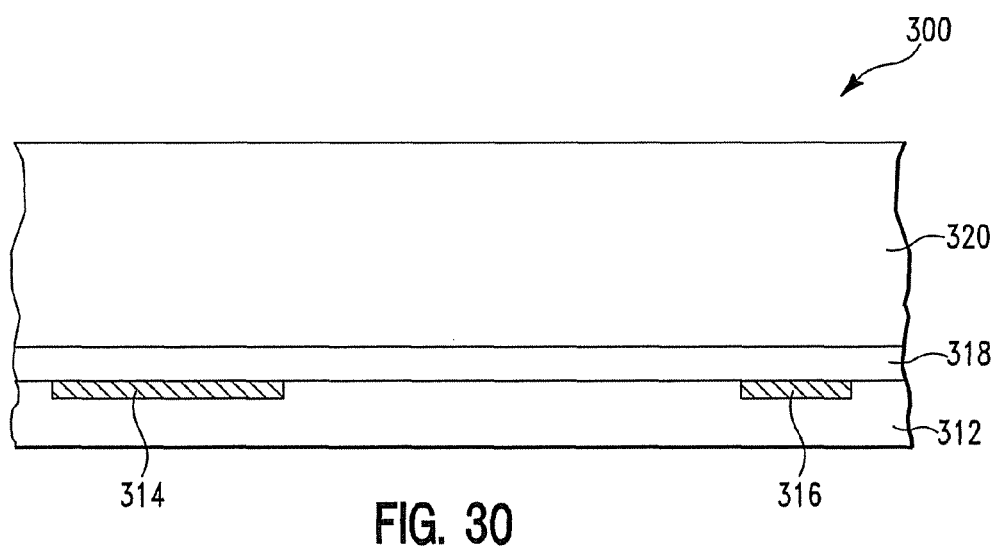
FIG. 30 depicts a cross-sectional view of a semiconductor structure comprising a capping layer and an insulative layer formed over a last metal wiring level, in accordance with a fourth embodiment of the present invention.

In accordance with a fourth embodiment, FIG. 30 shows a structure 300 comprising a substrate 312 including at least one conductive wire within a last metal wiring level, in this example, a first 314 and a second wire 316 are shown within the last metal wiring level. The structure 300 further includes a capping layer 318 and insulating layer 320 deposited over the surface of the last metal wiring level of the substrate 312, similar to layers 18 and 20 in FIG. 1 with thickness in the range of about ~0.1 μm and 1 μm, respectively. Although specific thickness values are given for layers 318 and 320, they could range in thickness from about 0.03-0.5 μm and 0.5-5 μm, respectively.

Figure 31:
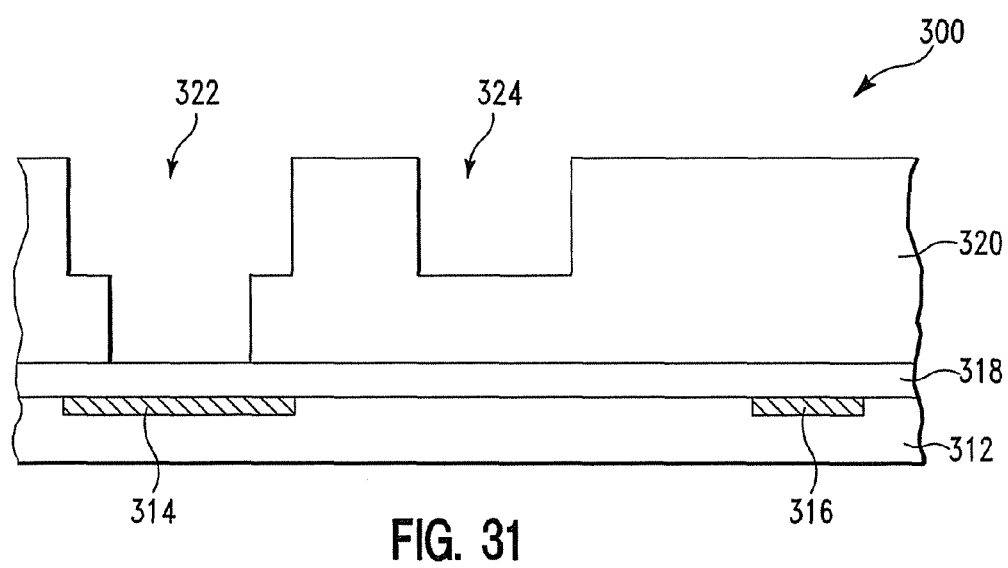
FIG. 31 depicts the structure of FIG. 30 having openings formed within the insulative layer.
Figure 32:
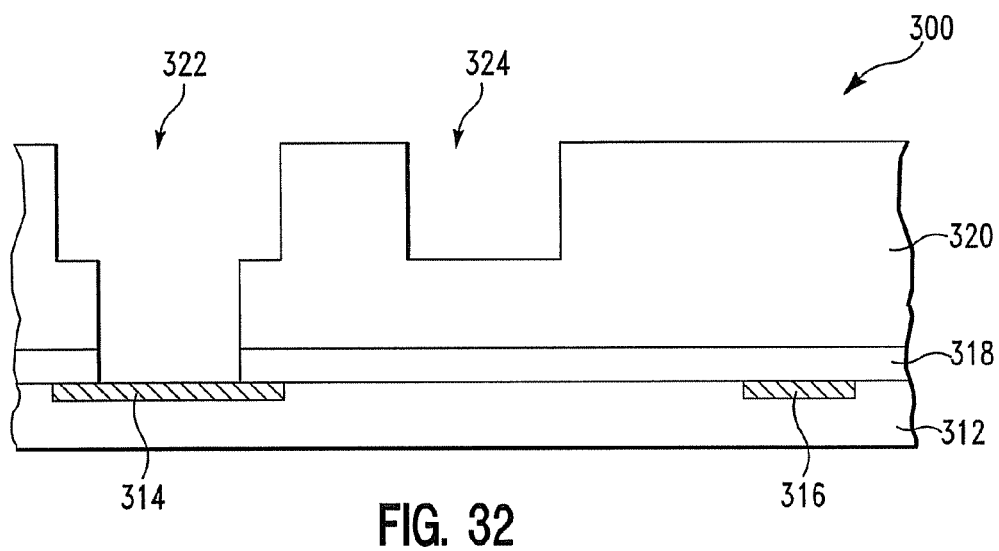
FIG. 32 depicts the structure of FIG. 31 wherein the capping layer is removed from within the opening.

At least one opening may be formed within the insulative layer 320. As illustrated in FIG. 31, a first dual damascene opening 322 and a second single damascene opening 324 are formed within the insulative layer 320 of this cross-sectional view. The dual damascene opening 322 is formed above the first wire 314 of the last metal wiring level. Dual damascene opens are formed by sequentially patterning and etching wires and vias, as known in the art. An etch process, e.g., a RIE process, is performed to remove the capping layer 318 from within the dual damascene opening 322 to expose the surface of the first wire 314 in the last metal wiring level, as shown in FIG. 32. Note that, although dual damascene wires and vias are shown, a single damascene process could be employed to form the via directly down to the wire 314.

Figure 33:
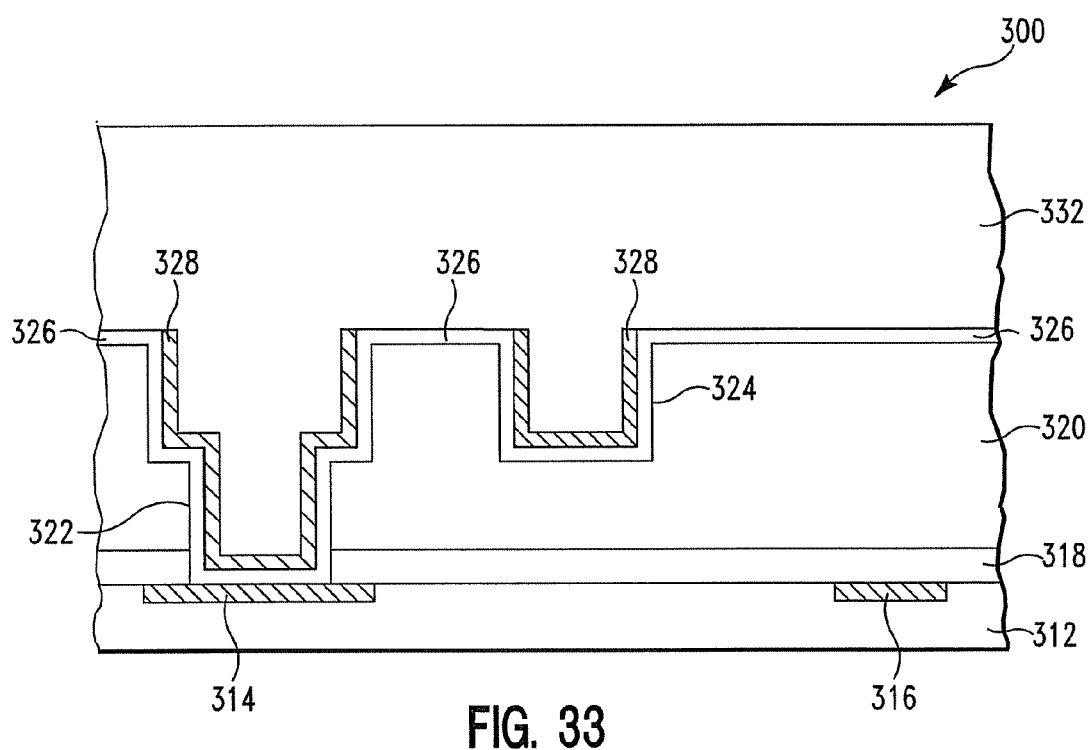
FIG. 33 depicts the structure of FIG. 32 following a partial patterned plate process and the deposition of a layer of photoresist.
Figure 34:
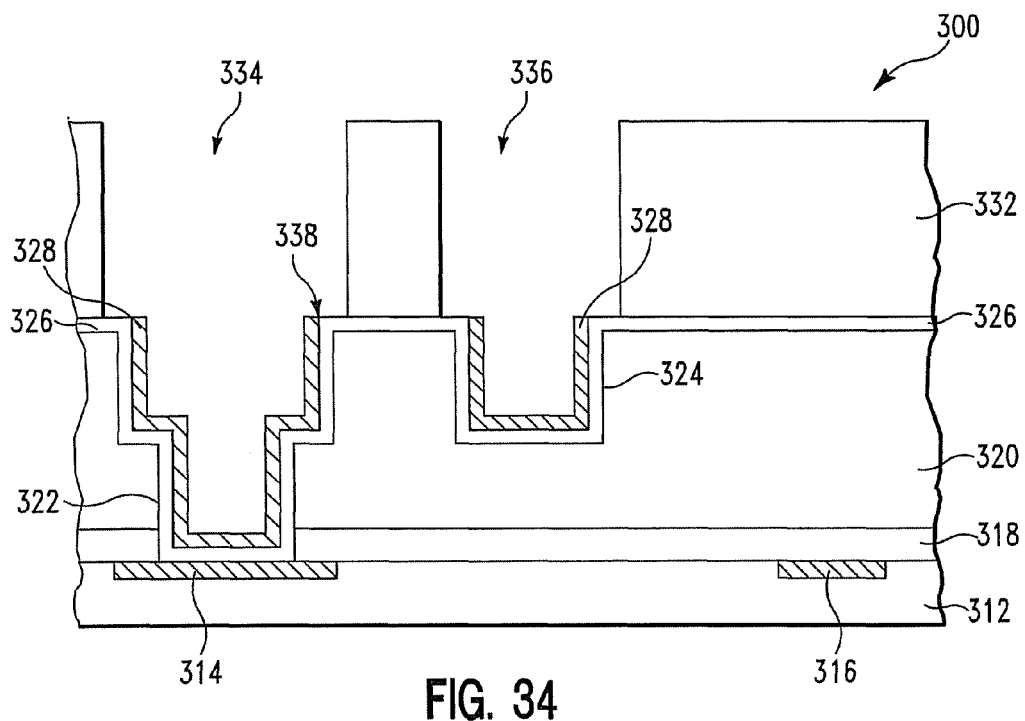
FIG. 34 depicts the structure of FIG. 33 having openings formed within the layer of photoresist.

As illustrated in FIG. 33, the patterned plate process described and illustrated in FIGS. 4-7 of the first embodiment, is used to deposit a liner 326, a seed layer 328 and a conductive material 330 within the first and second openings 322, 324. As illustrated in FIG. 33, the liner 326 does not need to be removed from the surface of the substrate 300. Also, following the CMP process used to remove the seed layer 328 on the surface of the structure 300, and prior to the deposition of the conductive material 330, (as depicted in FIG. 5 of the first embodiment), a layer of photoresist or PSPI 332 may be deposited over the surface of the structure 300. The photoresist 332 may be formed having a thickness of about 3-20 µm, e.g., 8.0 µm. The photoresist 332 is then patterned and developed to form a first 334 and a second opening 336 within the photoresist 332 above the first 322 and second openings 324 within the insulative layer 320, as shown in FIG. 34. It should be noted that the first and second openings 334, 336 made within the photoresist 332 have a width greater than the width of the first and second openings 322, 324 in the insulative layer 320, forming an "underlap" 338 in the range of about 0.1-5 µm, e.g., 200 nm. The underlap 338 leaves a portion of the liner 326 exposed, so that the photoresist 332 is fully removed from the trenches 322 and 324.

Figure 35:
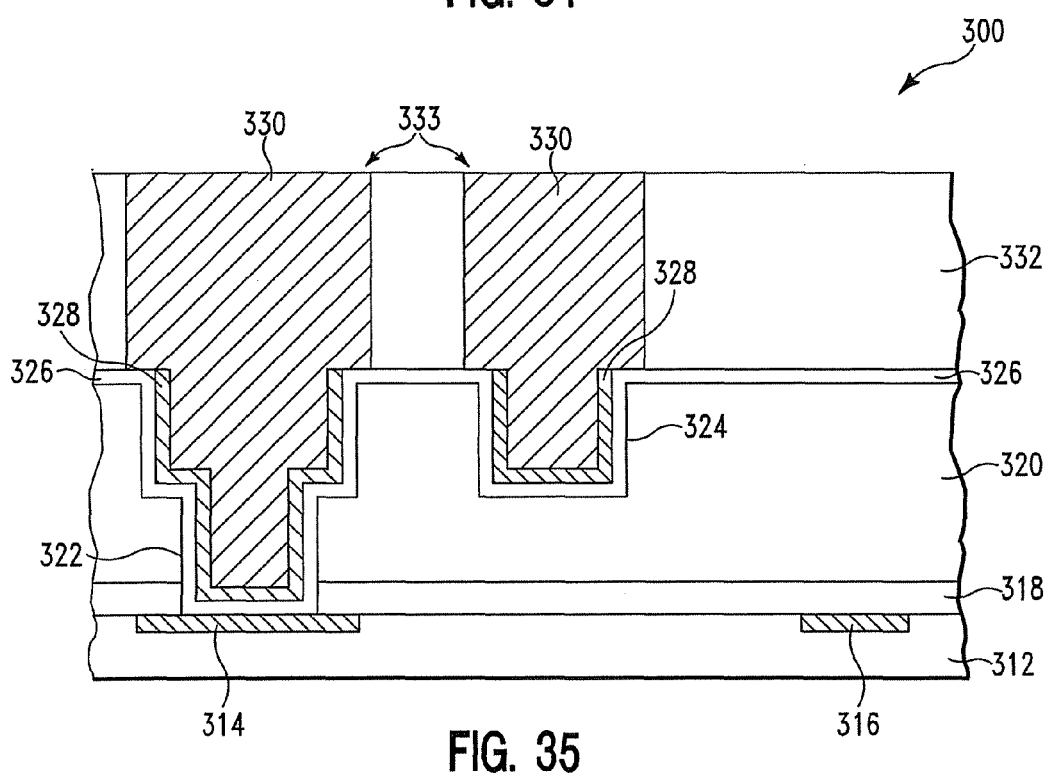
FIG. 35 depicts the structure of FIG. 34 following completion of the patterned plate process.

At this point, a patterned plate Cu or other conductor deposition is performed, preferably using Cu electroplating as discussed supra, to fill the features 334 and 336 with Cu 330. Next an optional Cu CMP step is performed to planarize the surface, as discussed supra and shown in FIG. 35.

Figure 36:
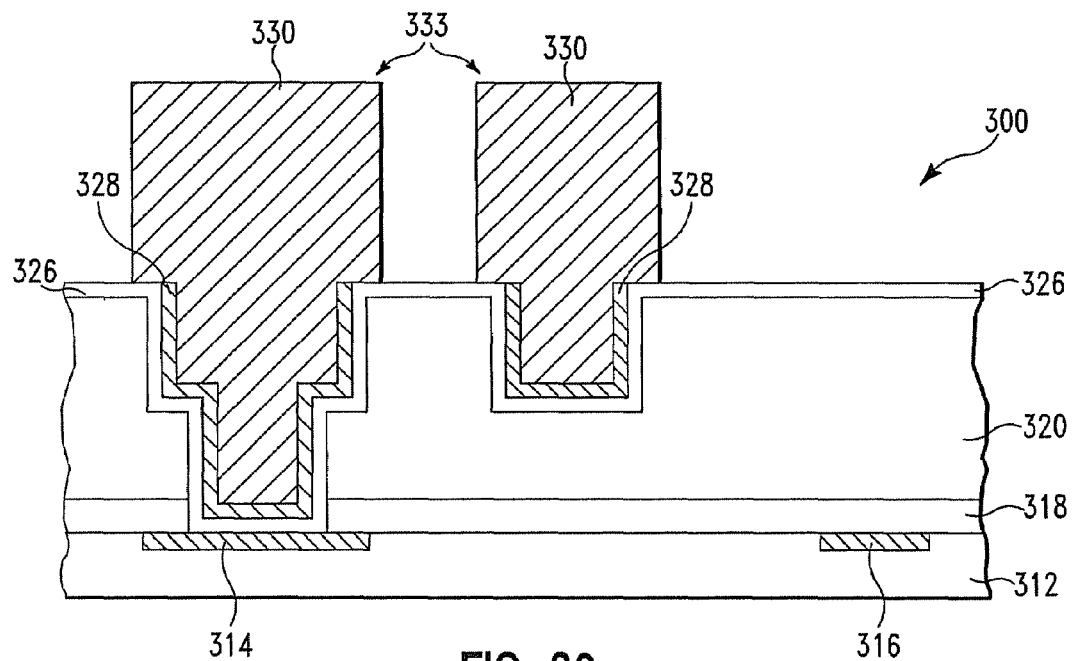
FIG. 36 depicts the structure of FIG. 35 following removal of the layer of photoresist.
Figure 37:
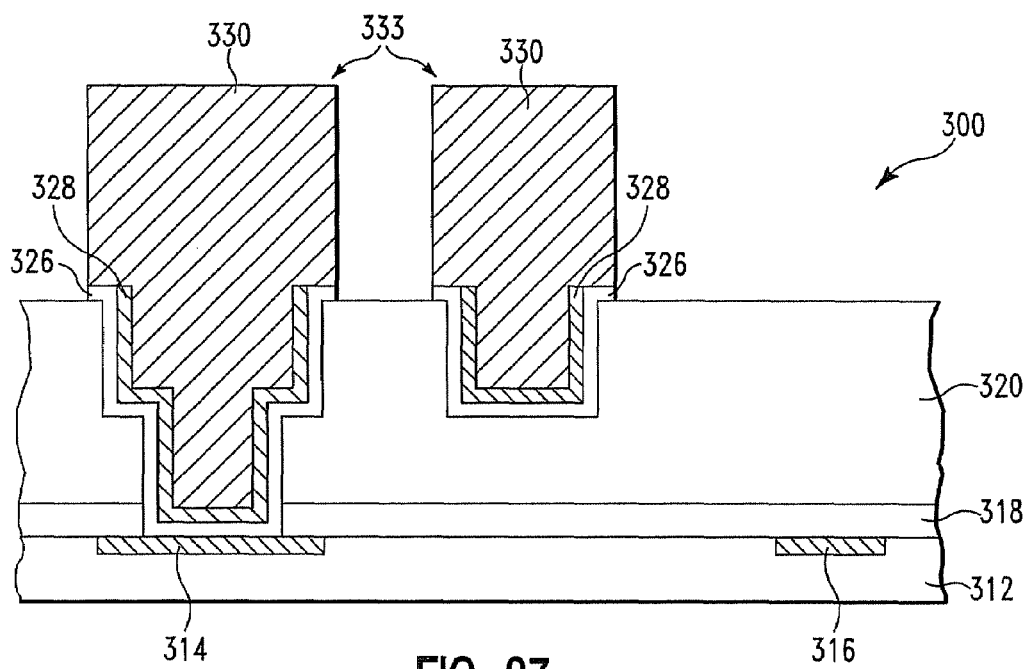
FIG. 37 depicts the structure of FIG. 36 following removal of the liner on the surface of the structure.

As illustrated in FIG. 36, the photoresist 332 is removed using a wet or dry strip as discussed supra, leaving the freestanding Cu wires. The exposed liner 326 is then removed from the surface of the structure 300 using perflourocarbon (PFC) RIE process, a wet etch such as hydrogen peroxide and ammonium hydroxide clean, etc., as shown in FIG. 37. Prior to forming the AlCu pad level, a Cu capping layer, either dielectric or conductive, is formed similar to layer 145 discussed in FIG. 21.

Figure 38:
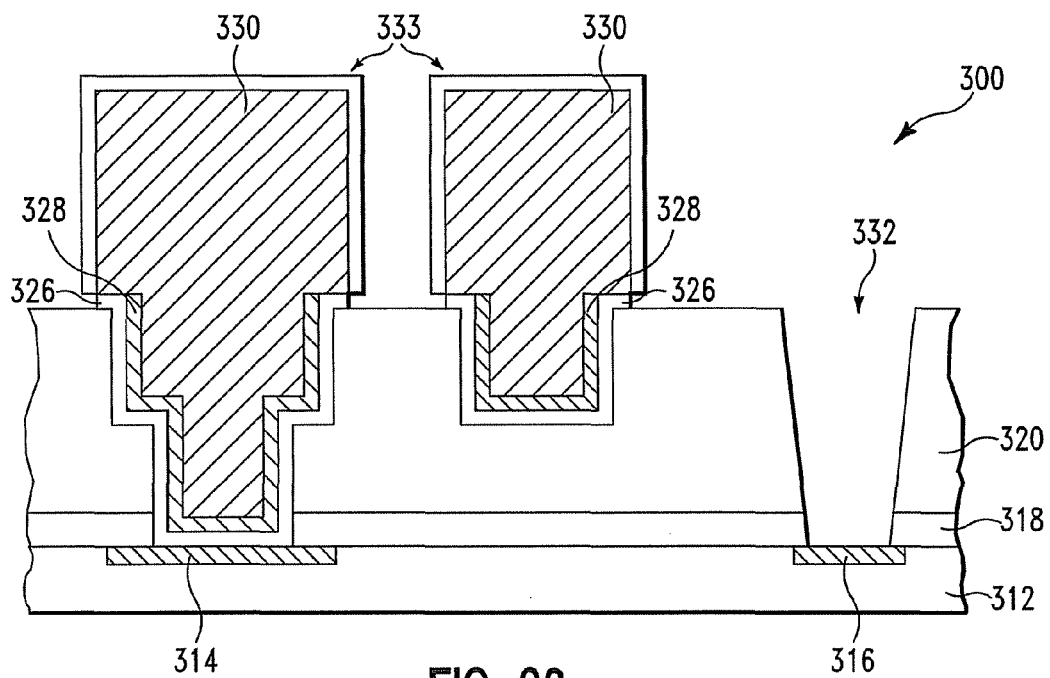
FIG. 38 depicts the structure of FIG. 37 having an opening formed within the insulative and capping layers.
Figure 39:
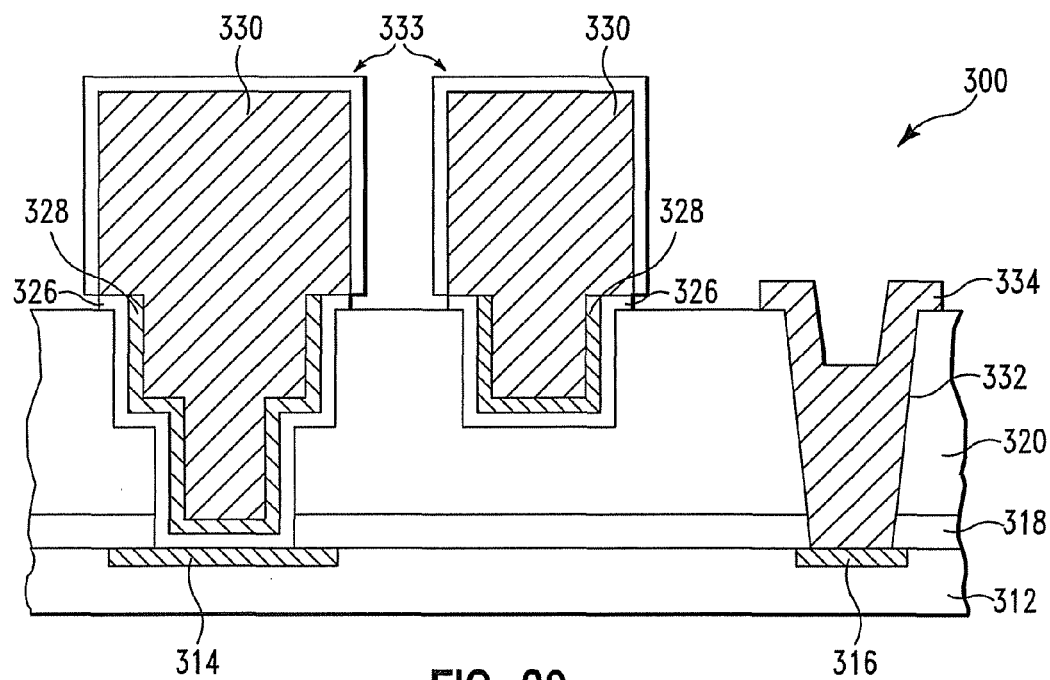
FIG. 39 depicts the structure of FIG. 38 having an electrical interconnection formed within the opening.

A layer of photoresist (not shown) may be applied over the surface of the structure 300 to form an opening 332 within the insulative layer 320 and the capping layer 318 down to the second wire 316 of the last metal wiring level, as shown in FIG. 38. Note that the use of a selective conductive cap (e.g., an electroless CoWP electroplated film) over the Cu wires is shown. An electrical interconnection, such as an AlCu wire bond pad 334, is then formed within the opening 332, as known in the art (FIG. 39).

The structure 300 forms a spiral inductor 333 having a top view similar to the one shown in FIG. 11.

Figure 40:
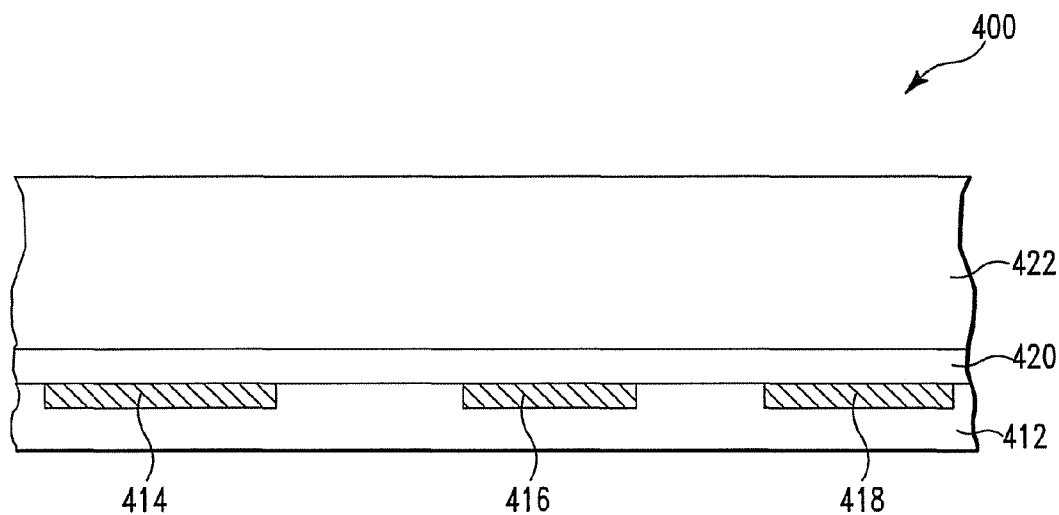
FIG. 40 depicts a cross-sectional view of a semiconductor structure comprising a capping layer and a photoresist layer formed over a last metal wiring level, in accordance with a fifth embodiment of the present invention.

In accordance with a fifth embodiment, FIG. 40 shows a structure 400 comprising a substrate 412 including at least one conductive element within a last metal wiring level, in this example, a first conductive wire 414 and portions of a transmission line, in this example two portions 416, 418 of an inductor are shown, within the last metal wiring level. The structure 400 further includes a capping layer 420 deposited over the surface of the last metal wiring level of the substrate 412. The capping layer 420 may comprise SiN, SiC, SiCN, etc., as discussed supra. The structure 400 further includes a layer of uncured photo-sensitive polyimide (PSPI) 422 formed over the capping layer 420. The PSPI 422 may be formed using spin-on processes, as known in the art, to a thickness in the range of about 1-30 µm, e.g., 6 µm.

Figure 41:
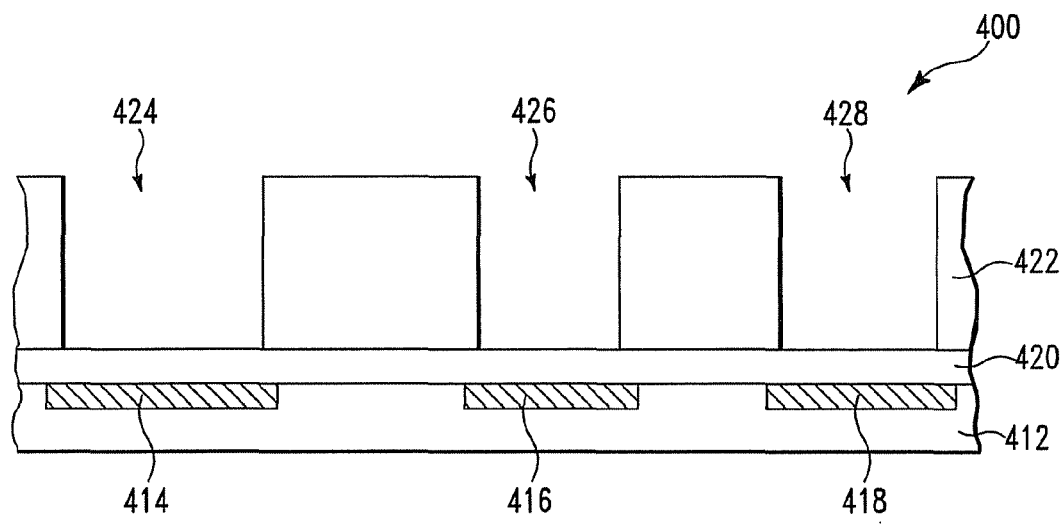
FIG. 41 depicts the structure of FIG. 40 having openings formed within the photoresist layer.

As illustrated in FIG. 41, a first 424, a second 426 and a third opening 428 are formed within this cross-sectional view of the PSPI 422 above the location of the first wire 414 and the two portions 416, 418 of the inductor within the last metal wiring level. The openings 424, 426, 428 within the PSPI 422 may be formed by exposing and developing the PSPI 422 using a mask (not shown), followed by a develop process and a curing process, as known in the art.

Figure 42:
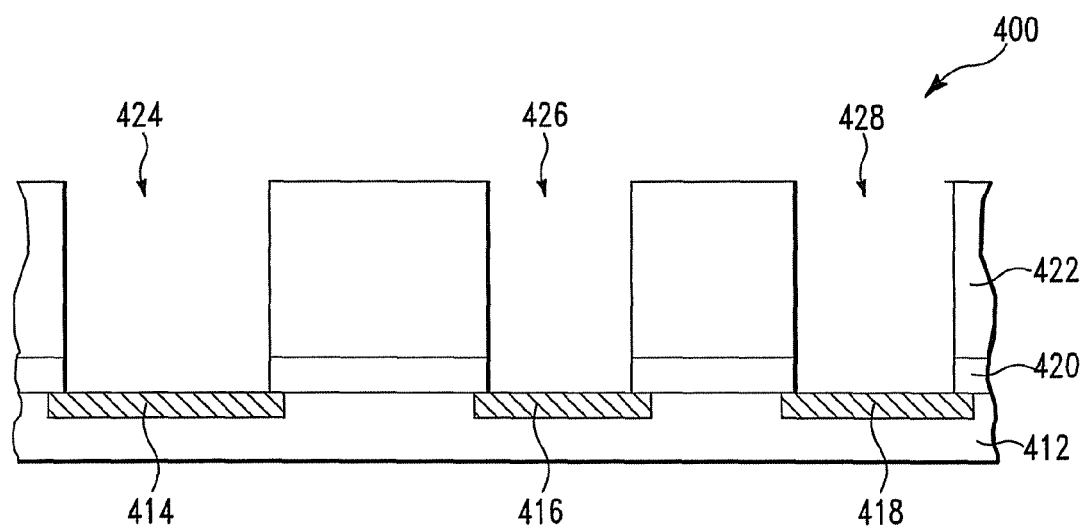
FIG. 42 depicts the structure of FIG. 41 following removal of the capping layer from within the opening.

As shown in FIG. 42, the capping layer 420 within the openings 424, 426, 428 is removed down to the surface of the last metal wiring level. The capping layer 420 may be removed using a standard RIE process in a parallel plate reactor with perfluorcarbons and oxidizers, as known in the art.

Figure 43:
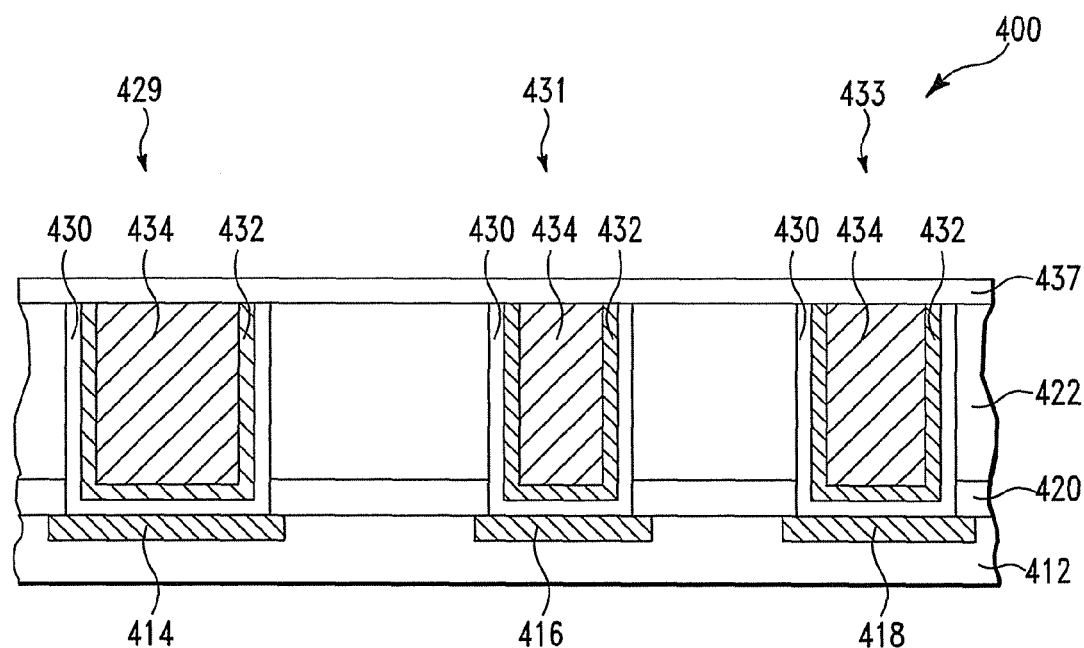
FIG. 43 depicts the structure of FIG. 42 following a patterned plate process.

The patterned plate process described in the first embodiment and illustrated in FIGS. 4-7 is then performed to deposit a liner 430, a seed layer 432 and a conductive material 434, thereby forming a conductive wire 429 and a first 431 and second 433 remaining portions of the inductor 435, as illustrated in FIG. 43. Next, a selective conductive Cu capping layer 437, (e.g., CoWP) is deposited over the surface of the structure, as described supra.

Figure 44:
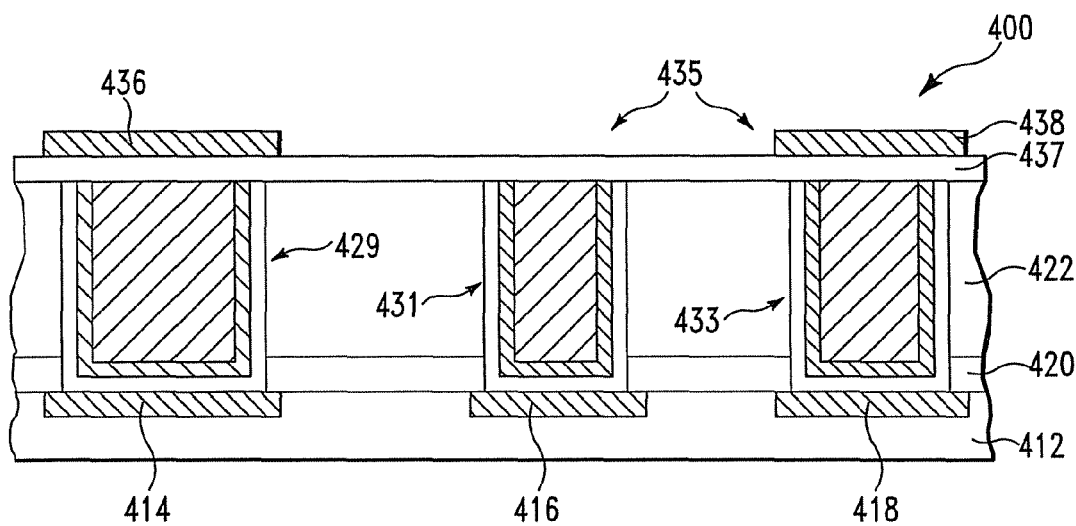
FIG. 44 depicts the structure of FIG. 43 following formation of electrical interconnections.

Electrical interconnections, such as wire bond pads or solder bumps 436, 438 are formed on the surface of the structure 400 as known in the art. In this example, the wire bond pads 436, 438 are formed above, and in electrical connection to, the conductive wire 429 and the second portion 433 of the inductor 435, respectively, (FIG. 44). Note that the wire bond pad 438 fully covers the Cu wires so that the Cu is not exposed to an AlCu etch process, which would corrode the Cu.

Figure 45:
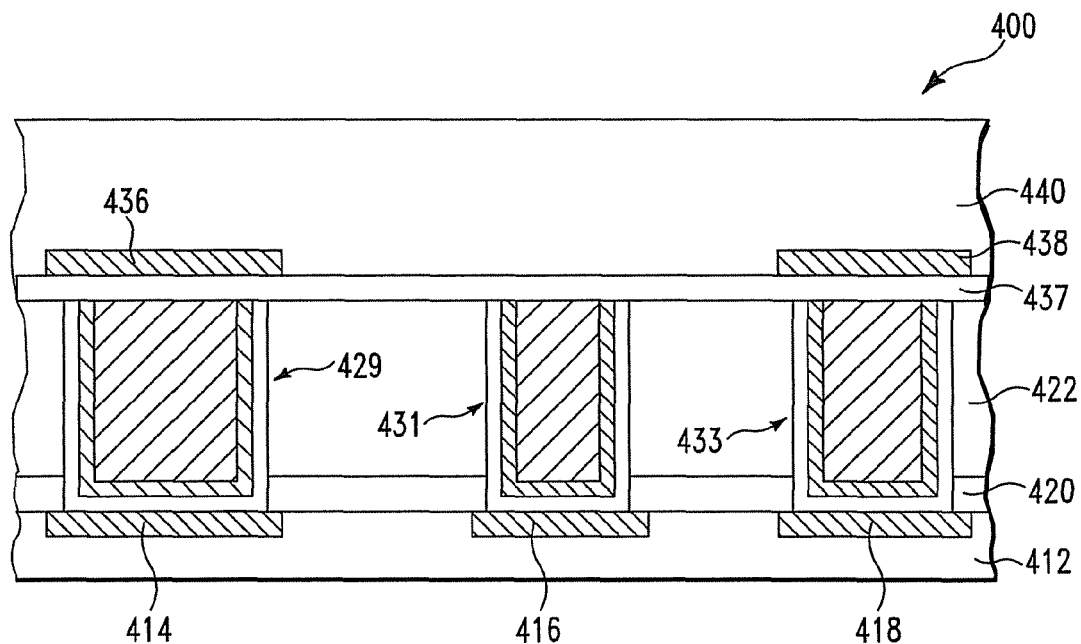
FIG. 45 depicts the structure of FIG. 44 having a dielectric layer formed over the surface of the structure.

As illustrated in FIG. 45, a layer of conformal dielectric 440 is deposited over the surface of the substrate 412. The dielectric 440 may comprise a layer of SiN, a layer of SiO, a second layer of SiN and a layer of polyimide, (the individual layers of the dielectric 440 are not shown for purposes of simplicity), and have a total thickness in the range of about 3-30 µm, e.g., 10 µm. Each of the layers of the dielectric 440 may be formed using plasma CVD or spin-on method, or other similar technique, as discussed supra.

Figure 46:
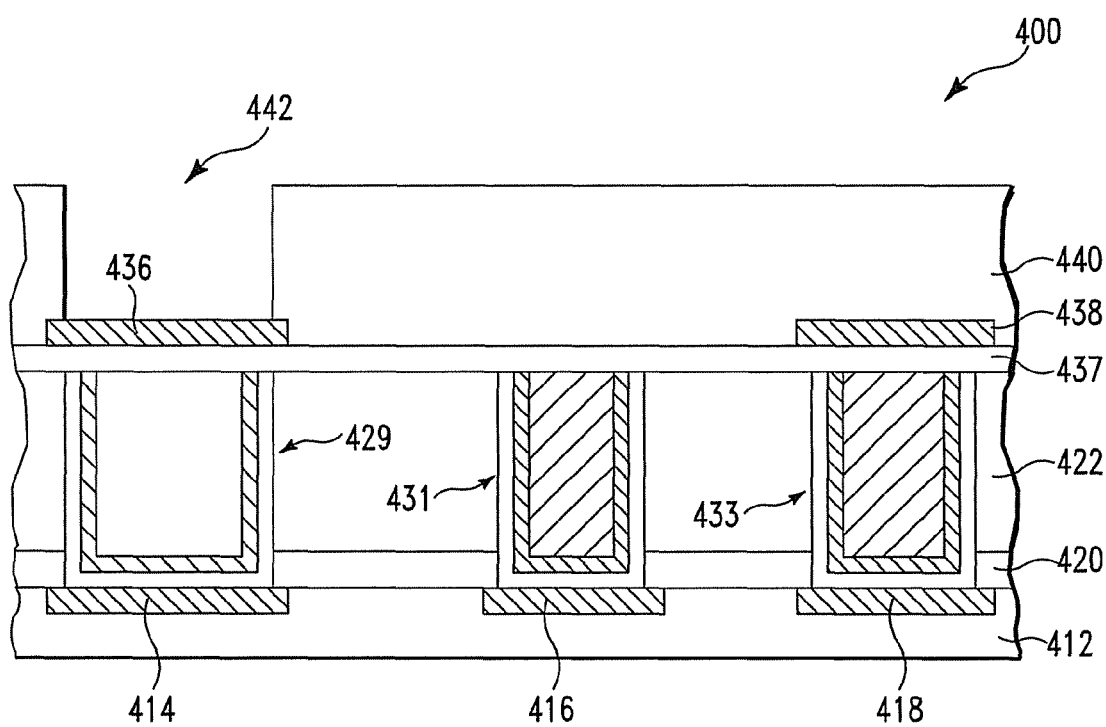
FIG. 46 depicts the structure of FIG. 45 having an opening within the dielectric layer to expose one of the electrical interconnections.

As illustrated in FIG. 46, an opening 442 is formed within the conformal dielectric 440 above the wire bond pad 436 connecting to the conductive wire 429. The opening 442 may be formed using PSPI develop, followed by a RIE, thereby exposing the wire bond pad 436 for electrical connection, as discussed supra.

The structure 400 is a spiral inductor 435 having a top view similar to the one shown in FIG. 11.

Figure 47:
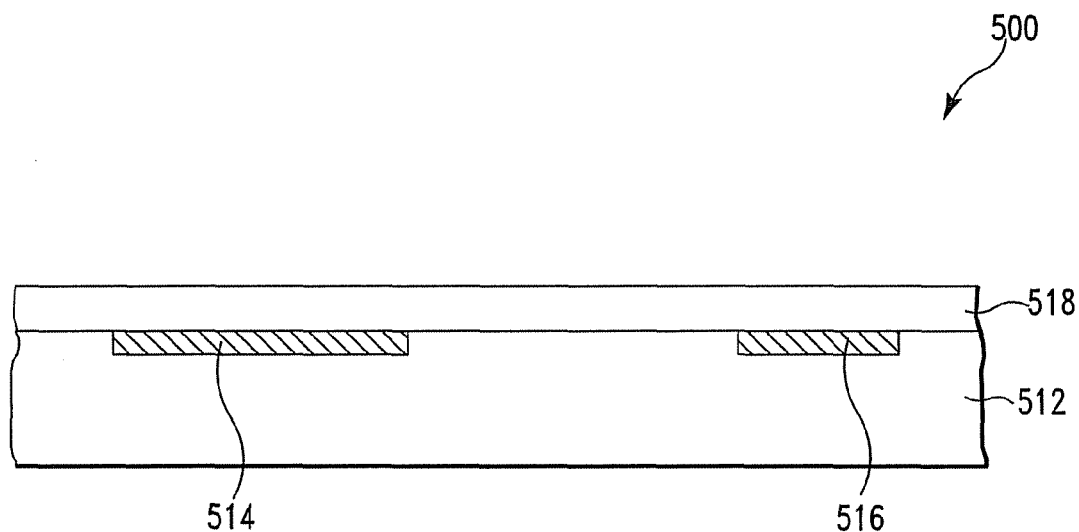
FIG. 47 depicts a cross-sectional view of a semiconductor structure comprising a substrate having a last metal wiring level formed therein, and a capping layer over the substrate, in accordance with a sixth embodiment of the present invention.

In accordance with a sixth embodiment, FIG. 47 shows a structure 500 comprising a substrate 512 including at least one conductive element within a last metal wiring level, in this example, a first conductive wire 514 and at least one portion of an inductor 516. The structure 500 further includes a capping layer 518 deposited over the surface of the last metal wiring level of the substrate 512. The capping layer 518 may comprise SiN, SiC, SiCN, etc., as discussed supra.

Figure 48:
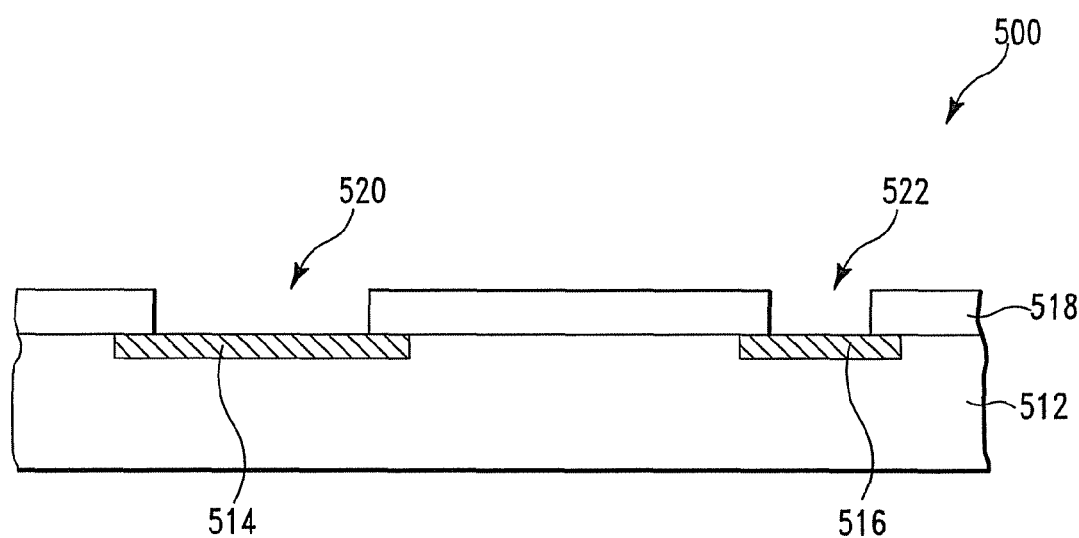
FIG. 48 depicts the structure of FIG. 47 having openings formed within the capping layer.
Figure 49:
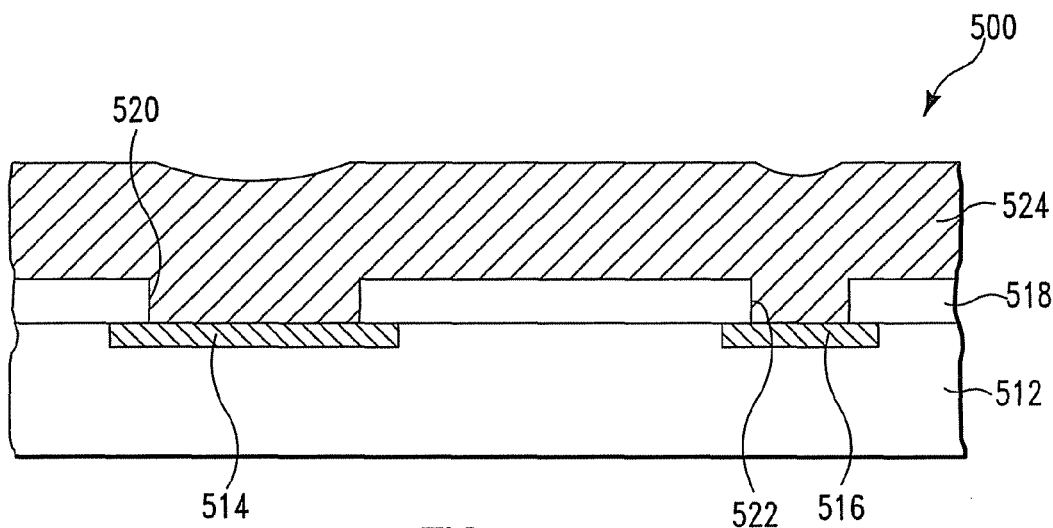
FIG. 49 depicts the structure of FIG. 48 having a conductive layer deposited over the capping layer.

As shown in FIG. 48, openings 520, 522 are formed within the capping layer 518 down to the surface of, and in connection with, the wire 514 and the inductor 516, respectively, within the last metal wiring level. The openings 520, 522 may be formed using conventional photoresist and etching processes (not shown). A layer of conductive material 524, such as TaN/Ti/TiN/AlCu/TiN, is then deposited over the surface of the structure filling the openings 520, 522 (FIG. 49). The layer of conductive material 524 may have a thickness in the range of about 0.3-6 µm, e.g., 1 µm and the AlCu portion of the stack comprises most of the total thickness.

Figure 50:
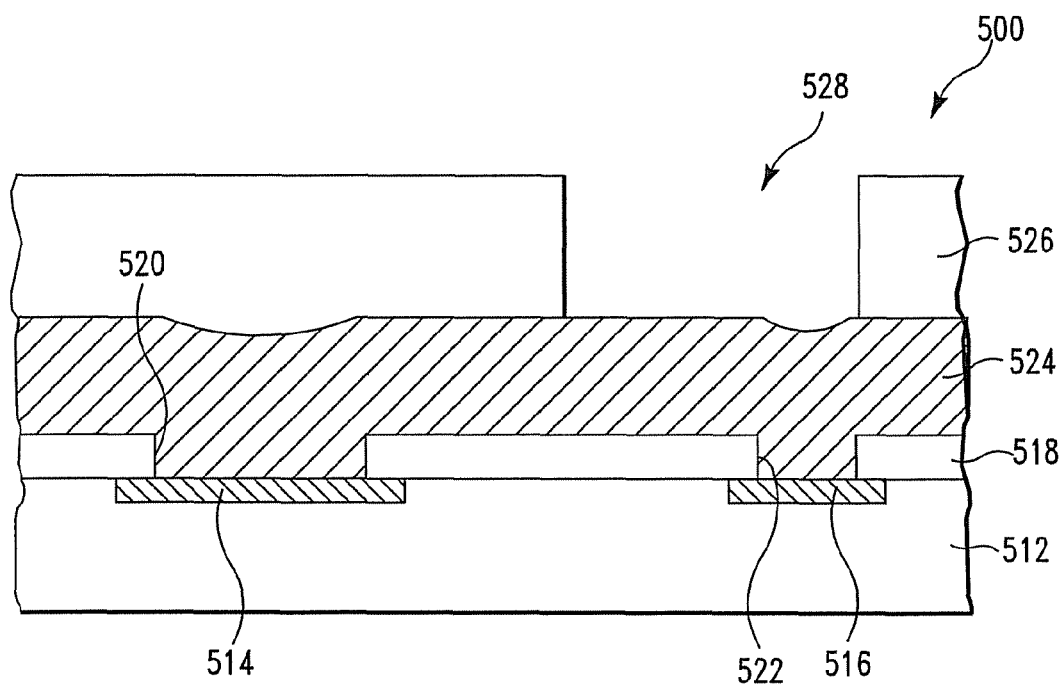
FIG. 50 depicts the structure of FIG. 49 having a patterned layer of photoresist over the conductive layer.

A layer of photo-imagable material, such as PSPI 526, or other similar material is deposited over the surface of the structure 500. As illustrated in FIG. 50, at least one opening 528 is formed within the PSPI 526 above the portion of the inductor 516, using conventional photoresist processing. The layer of PSPI 526 may have a thickness in the range of about 1-30 µm, e.g., 10 µm.

Figure 51:
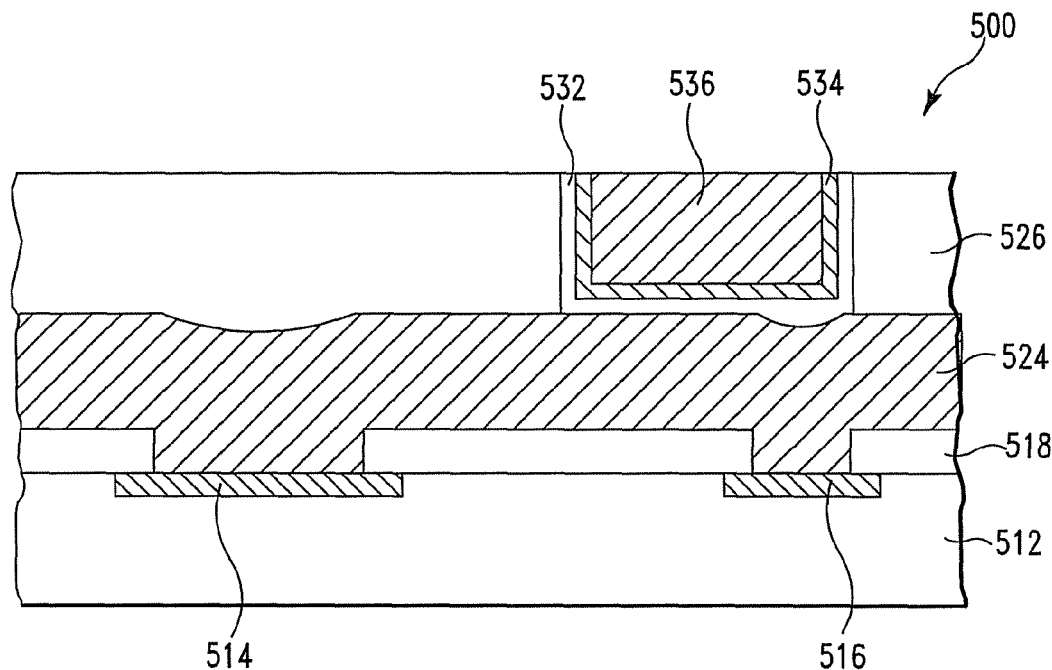
FIG. 51 depicts the structure of FIG. 50 following a patterned plate process.
Figure 52:
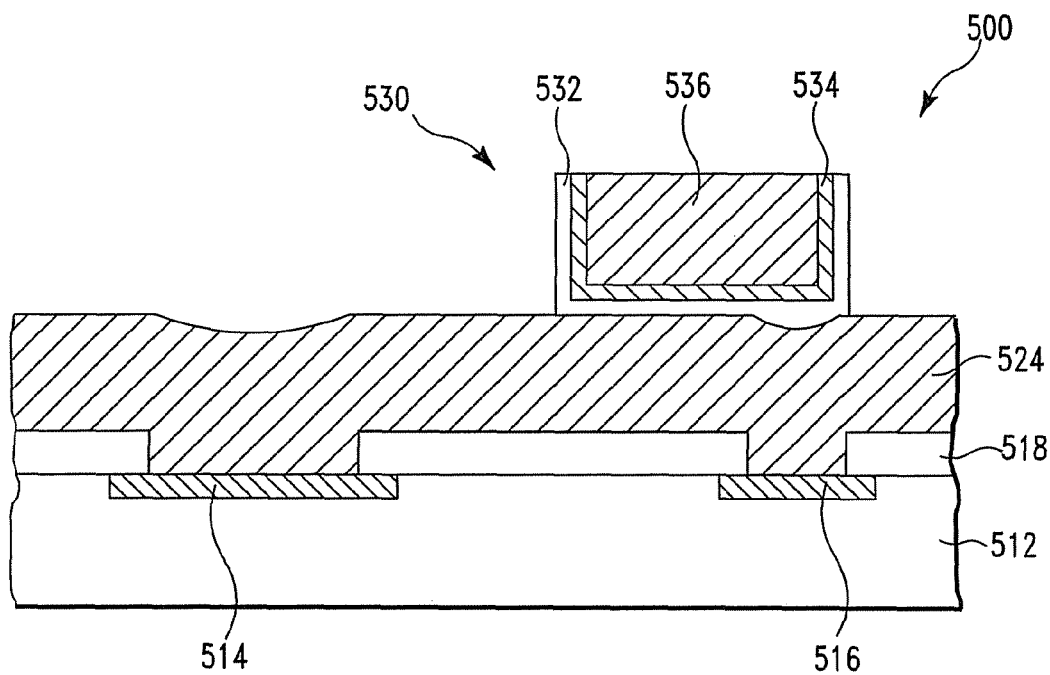
FIG. 52 depicts the structure of FIG. 51 following removal of the layer of photoresist.

The patterned plate process described in the first embodiment and illustrated in FIGS. 4-7 is then performed on the structure 500 to form the electrical connection 530, comprising a liner 532, a seed layer 534 and a conductive material 536, illustrated in FIG. 51. Thereafter, the PSPI 526 is removed using a non-oxygen plasma resist strip, a wet resist strip with a DHF clean, or other similar process (FIG. 52).

Figure 53:
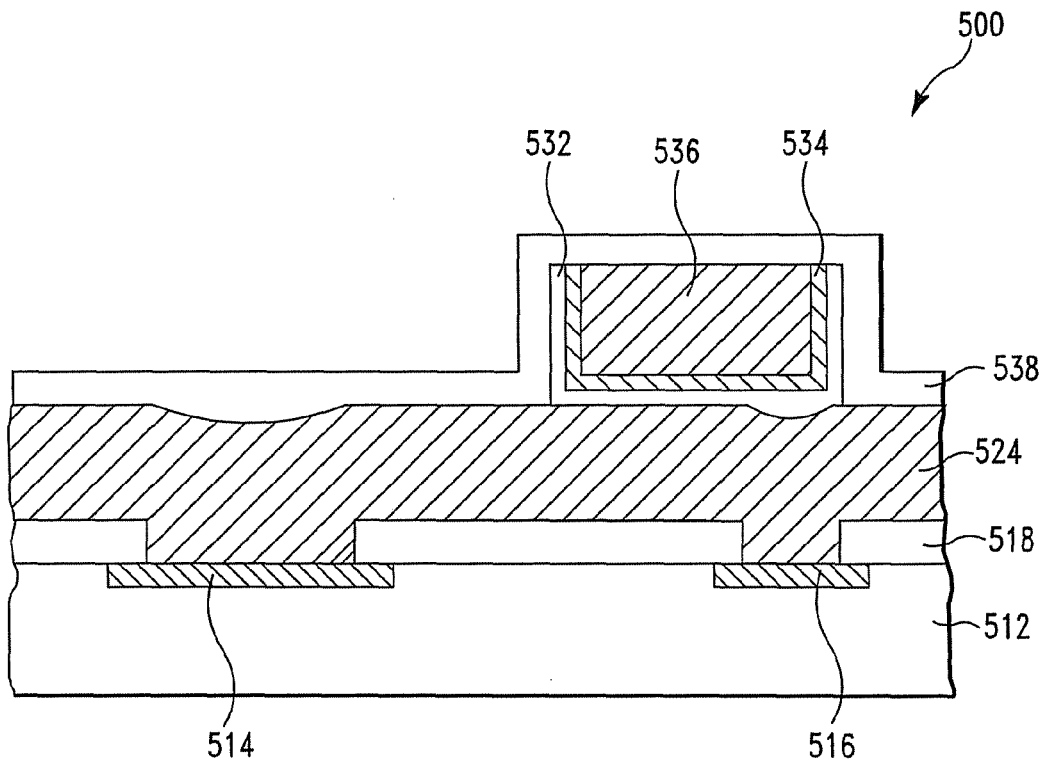
FIG. 53 depicts the structure of FIG. 52 having a dielectric layer deposited over the surface of the structure.

As illustrated in FIG. 53, an insulative Cu diffusion barrier layer 538, comprising SiN, SiCN, etc., is deposited over the surface of the structure 500. The insulative layer 538 may be formed using plasma enhanced deposition or other similar deposition technique, to a thickness in the range of about 0.05-1 µm, e.g., 0.1 µm.

Figure 54:
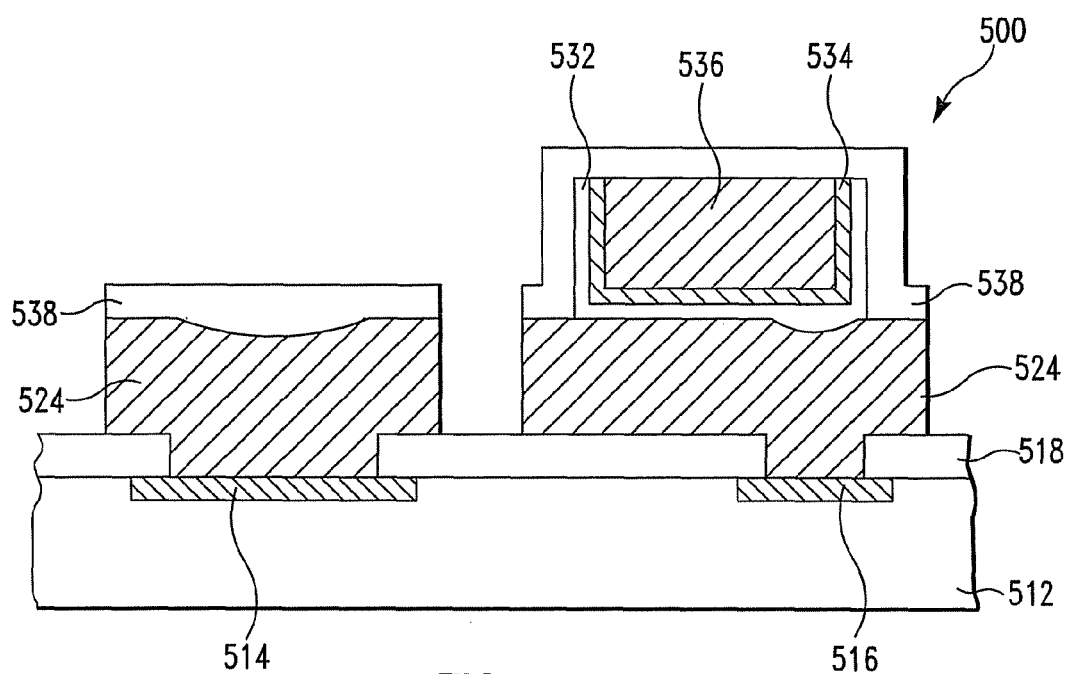
FIG. 54 depicts the structure of FIG. 53 following etching.

The insulative layer 538 is then lithographically patterned (using a layer of photoresist, not shown) and etched, for example, using a RIE process, to remove select portions of the insulative layer 538 and the layer of conductive material 524 from the structure 500, leaving the conductive material 524 and the insulative layer 538 above the wire 514 and the portion of the inductor 516 (FIG. 54).

Figure 55:
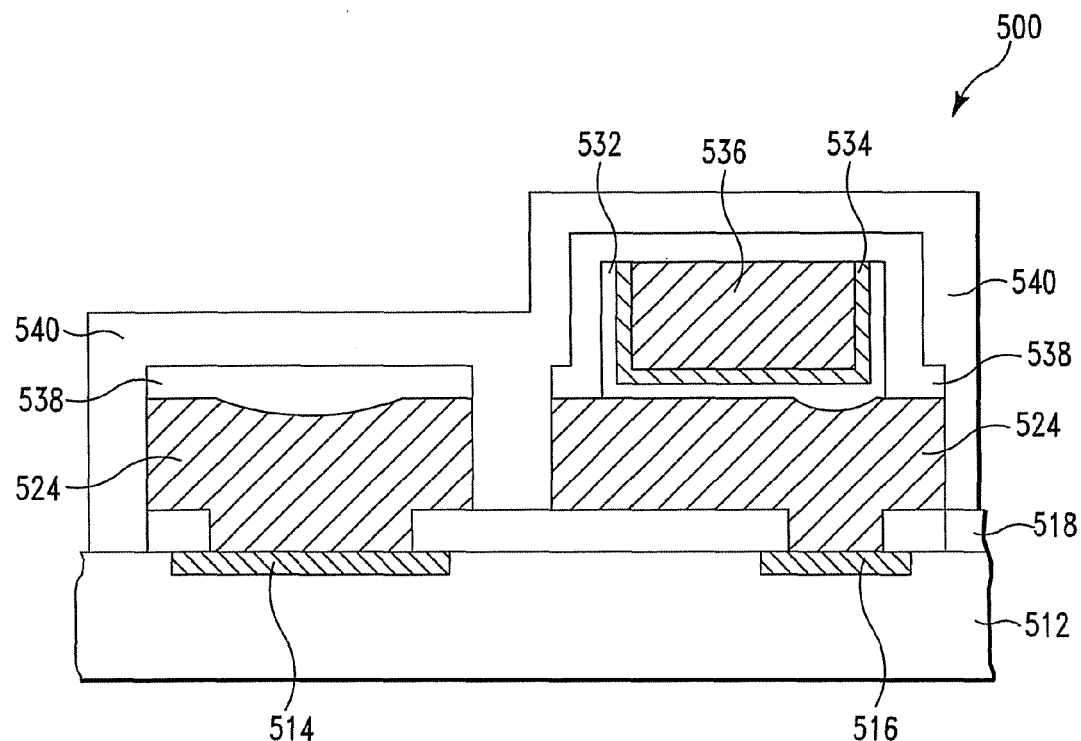
FIG. 55 depicts the structure of FIG. 54 having a second dielectric layer deposited over the surface of the structure.

As illustrated in FIG. 55, a dielectric layer 540 is conformally deposited over the surface of the structure 500. The dielectric layer 540 may comprise a combination of $SiO_2$, SiN and polyimide, as discussed supra. The dielectric layer 540 may be deposited using PECVD and spin-on, or other similar process. The individual layers of the dielectric 540 are not shown for purposes of simplicity.

Figure 56:
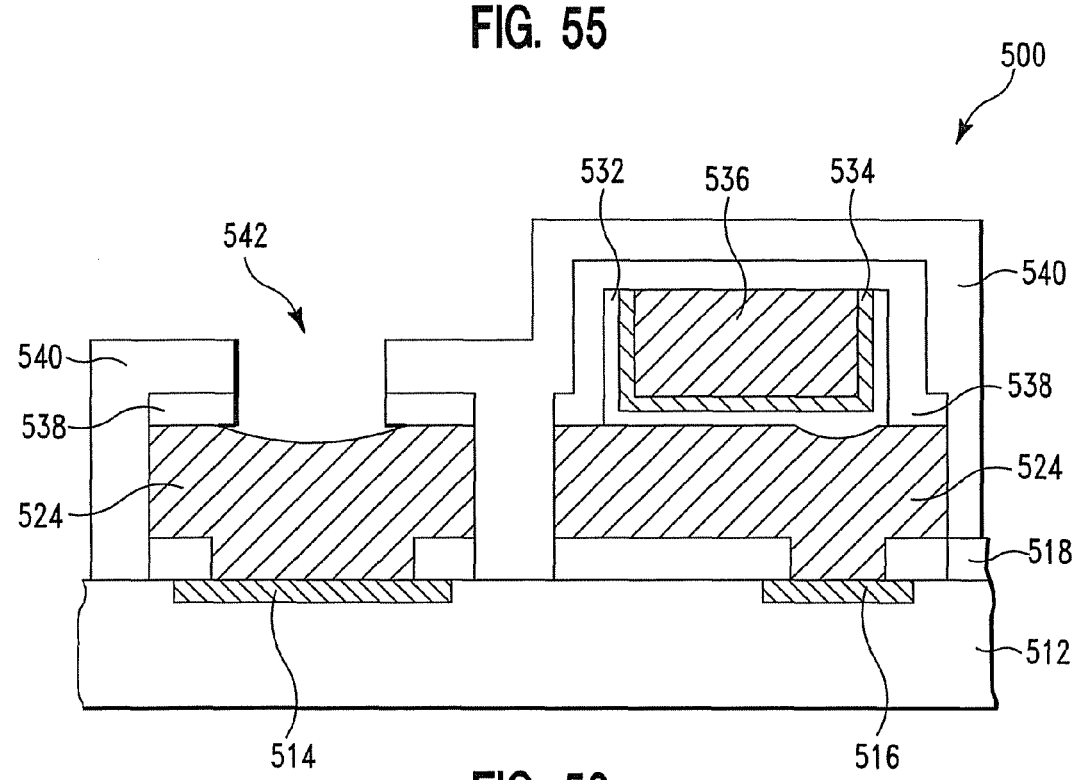
FIG. 56 depicts the structure of FIG. 55 having an opening formed within the second dielectric layer.
Figure 57:
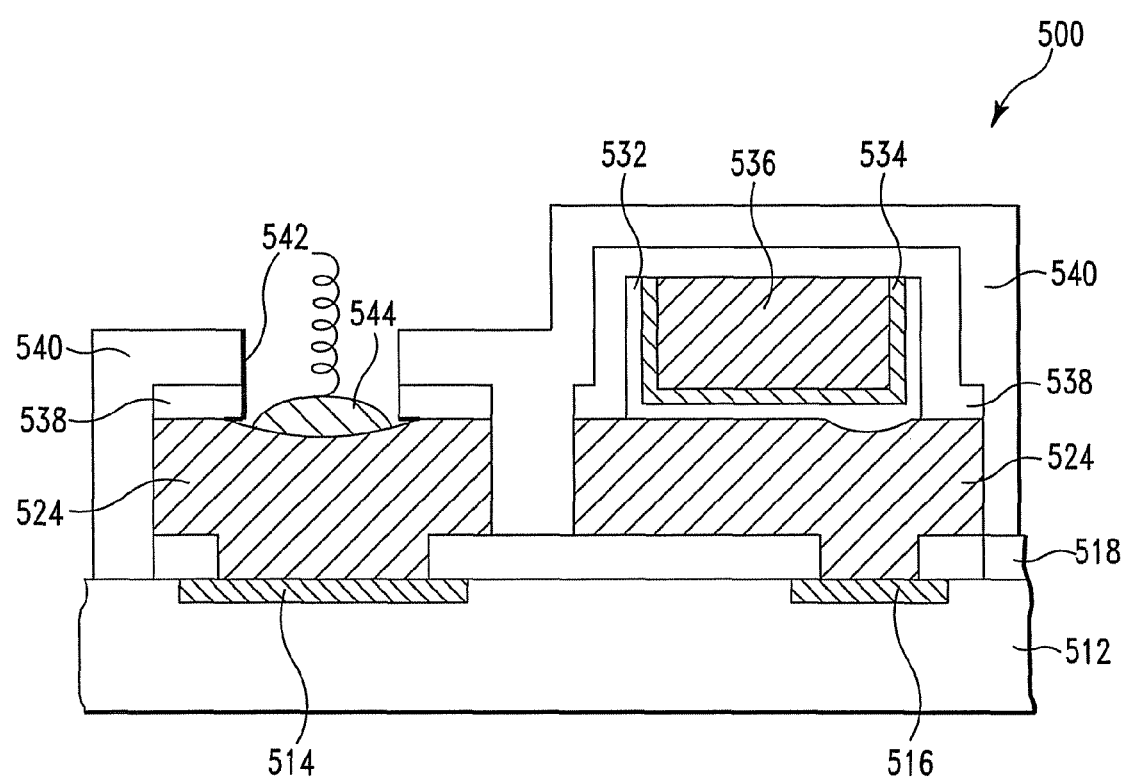
FIG. 57 depicts the structure of FIG. 56 having an electrical interconnection formed within the opening in the second dielectric layer.

An opening 542 is formed within the dielectric layer 540 above the wire 514, as illustrated in FIG. 56. The opening 542 may be formed within the dielectric layer 540 using lithographic patterning and etching, as known in the art. The opening 542 is formed through the dielectric layer 540 and the insulative layer 538 down to the surface of the conductive material 524. As illustrated in FIG. 57, an electrical interconnection, such as a wire bond 544 is formed within the opening 542 using conventional wire bond formation processes.

The structure 500 is a spiral inductor 533 having a top view similar to the one shown in FIG. 11.

Figure 58:
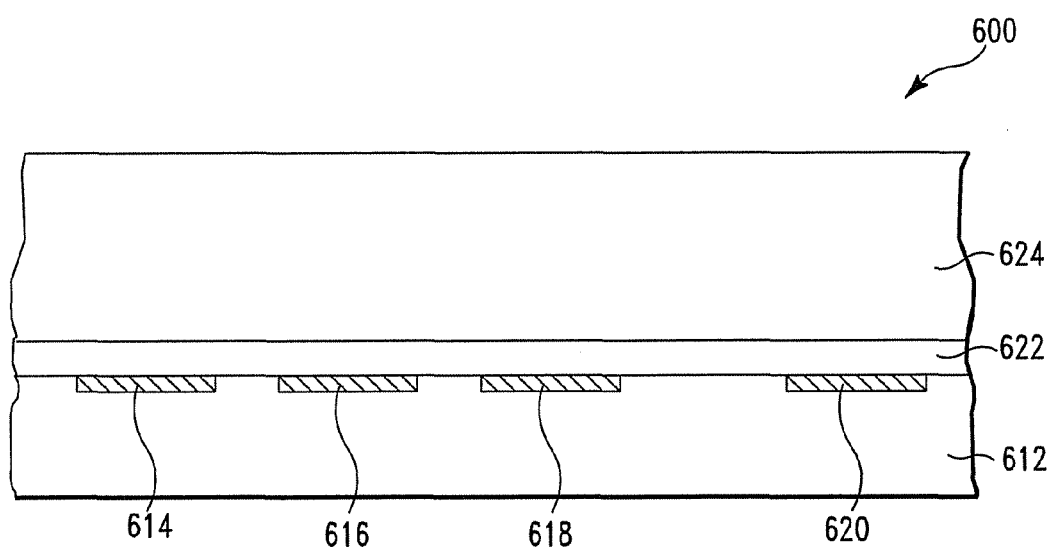
FIG. 58 depicts a cross-sectional view of a semiconductor structure comprising a substrate having a last metal wiring level formed therein, a capping layer and a layer of photoresist over the substrate, in accordance with a seventh embodiment of the present invention.

In accordance with a seventh embodiment, FIG. 58 shows a structure 600 comprising a substrate 612 including at least one conductive element within a last metal wiring level, in this example, a plurality of conductive wires 614, 616, 618, 620 within a last metal wiring level of the structure 600. It should be noted that the last metal wiring level could be wired in parallel to underlying wires using vias to decrease the overall resistance of the structure 600. A surface clean, such as a 10 second $NH_3$ or $H_2$ plasma may be performed. A capping layer 622, such as SiN, SiCN, etc., is then deposited over the surface of the structure 600 using PECVD, HDPCVD, etc. The capping layer 622 may be deposited having a thickness in the range of about 20-200 nm, e.g., 100 nm.

Optionally, a passivation layer (not shown) may be deposited over the capping layer 622, such as $SiO_2$ or a two layer dielectric, comprising $SiO_2$/SiN. The passivation layer may be formed having a total thickness in the range of about 0-2 µm, e.g., 0.5 µm. The passivation layer may be deposited using PECVD, or other commonly used method.

Figure 59:
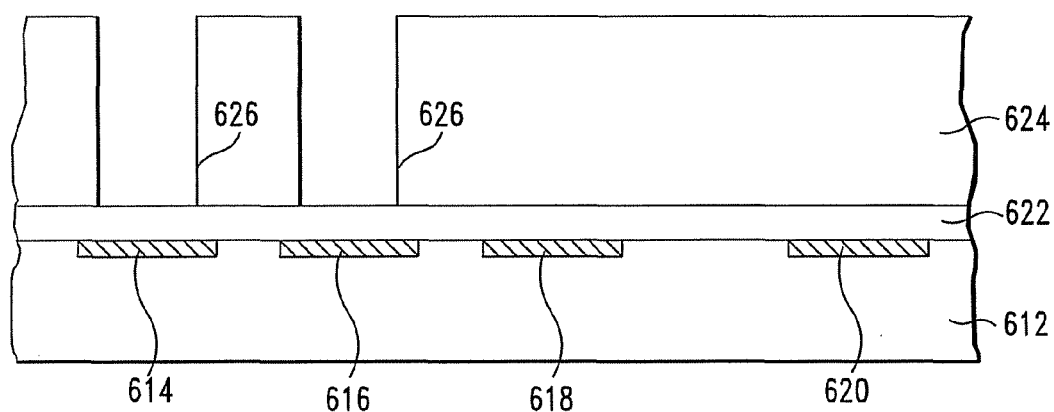
FIG. 59 depicts the structure of FIG. 58 having vias formed therein.
Figure 60:
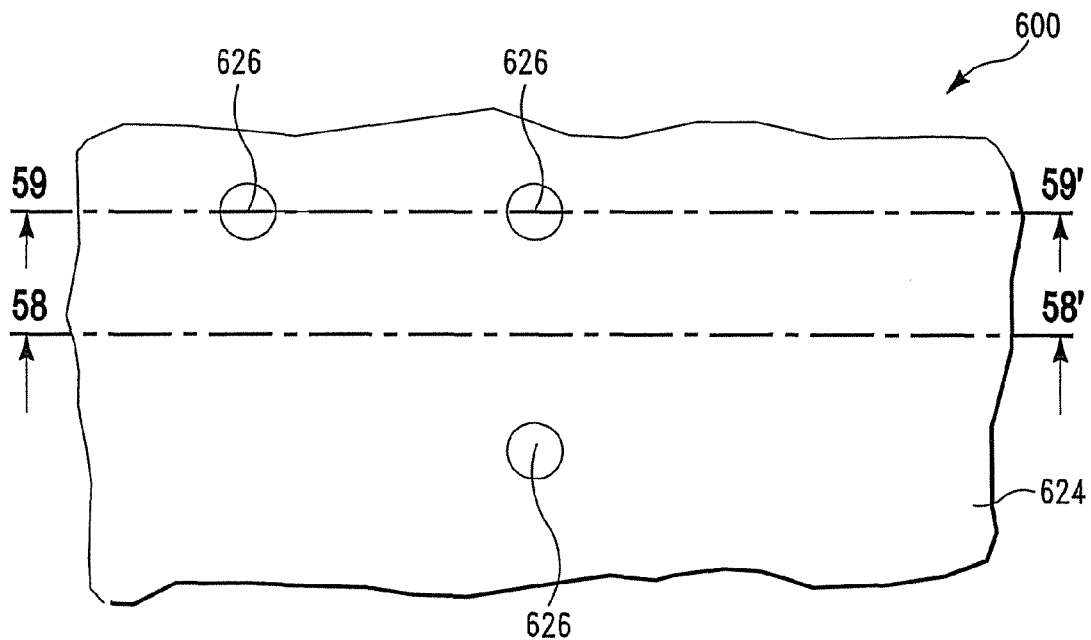
FIG. 60 depicts a top view of the structure of FIG. 58 having vias formed within the structure.

A layer of photo-imagable material, such as PSPI 624 is deposited over the surface of the structure 600, as further illustrated in FIG. 58. The PSPI 624 may be formed using spin-on, or other similarly used technique, to a thickness in the range of about 5-50 µm, e.g., 10 µm. The PSPI 624 is then patterned and developed to form at least one via opening 626, as illustrated in the cross-section view of the structure in FIG. 59, and the top view of the structure in FIG. 60. The PSPI 624 is then cured using known curing techniques.

Figure 61:
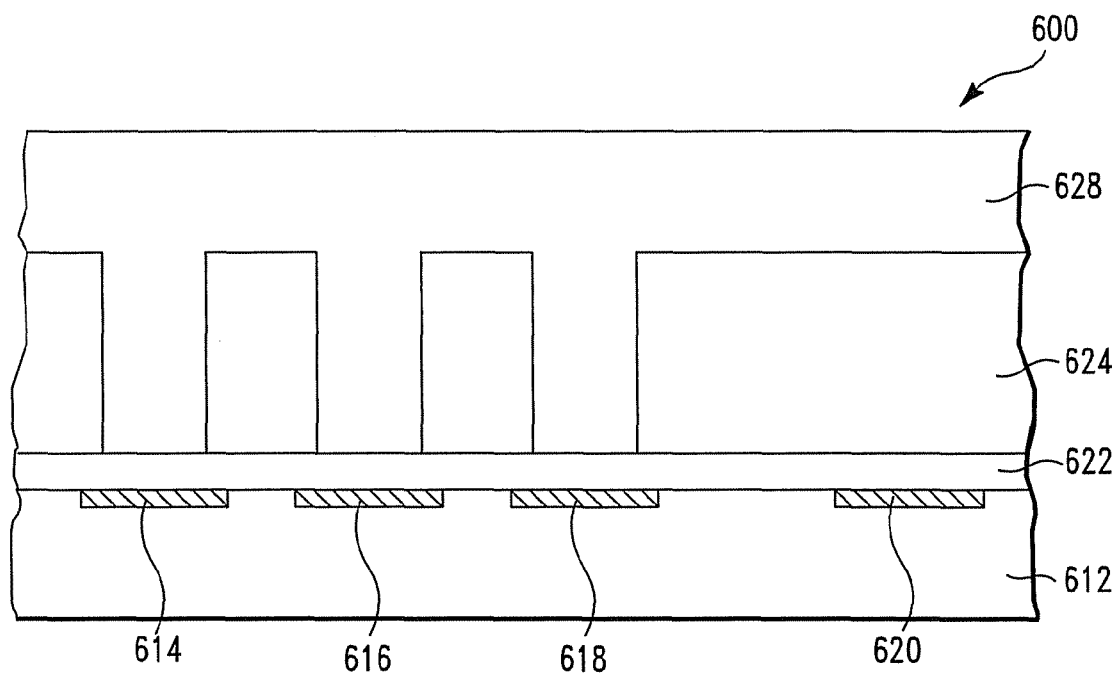
FIG. 61 depicts the structure of FIG. 60 having a second layer of photoresist deposited over the surface of the structure.
Figure 62:
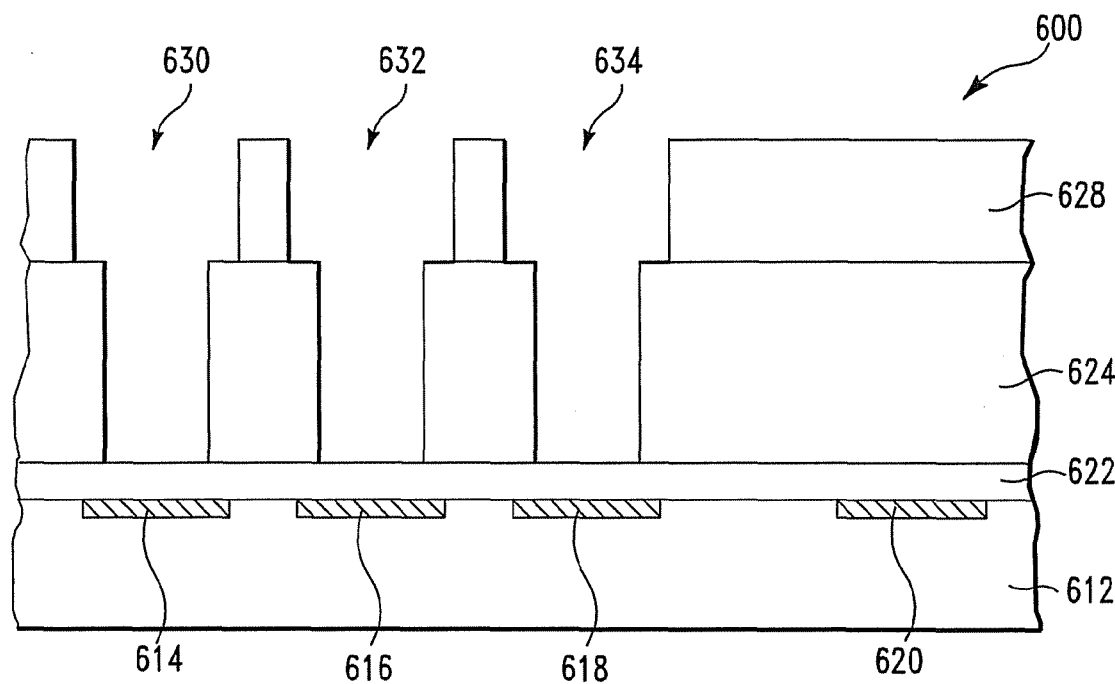
FIG. 62 depicts the structure of FIG. 61 having troughs formed within the photoresist layers.

As illustrated in FIG. 61, (wherein FIGS. 58 and 61-66 are taken along line 58-58' of FIG. 60), a second layer of photoresist 628 is then applied over the surface of the structure 600. The second layer of photoresist 628 may be deposited having a thickness in the range of about 5-15 µm, e.g., 10 µm. The second layer 628 is then patterned and developed to form a plurality of feature openings 630, 632, 634, as shown in FIG. 62, which later become inductor wires.

Figure 63:
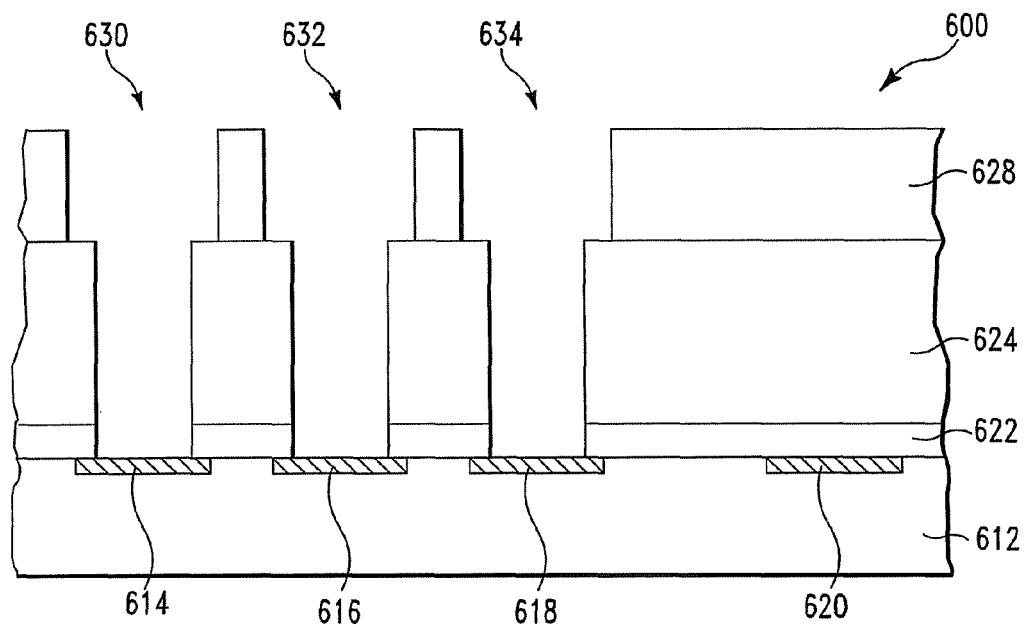
FIG. 63 depicts the structure of FIG. 62 having the capping layer removed from the base of the troughs.

A RIE, e.g., using PFC or PFC/HFC chemistry, is performed to remove the capping layer 622, and optional passivation layer (not shown), at the bottom of the openings 630, 632, 634 exposing the wires 614, 616, 618, respectively, of the last metal wiring level, as shown in FIG. 63. An optional post etch clean may be performed using DHF, e.g., for 60 seconds, using a 100:1 DHF. Preferably in a cluster tool, degas the substrate 612 (for example, at 150-400° C., e.g., 100:1 DHF, for 150 seconds at about 200° C.). An argon sputter clean may then be performed to further clean the substrate 612 and exposed metal wires 614, 616, 618 at the bottom of the openings 630, 632, 634, as known in the art.

Figure 64:
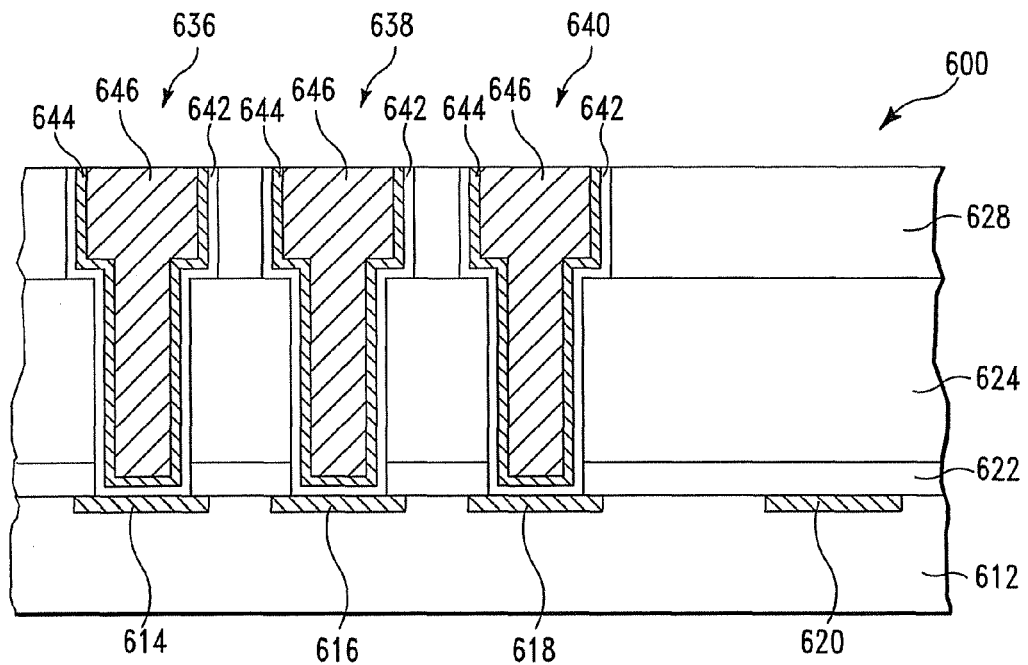
FIG. 64 depicts the structure of FIG. 63 following a patterned plate process.

The patterned plate process described in the first embodiment, and illustrated in FIGS. 4-7, is then performed to form first 636, second 638 and third 640 portions of a transmission line or inductor 645, comprising a liner 642, a seed layer 644 and a conductive material 646, as shown in FIG. 64.

Figure 65:
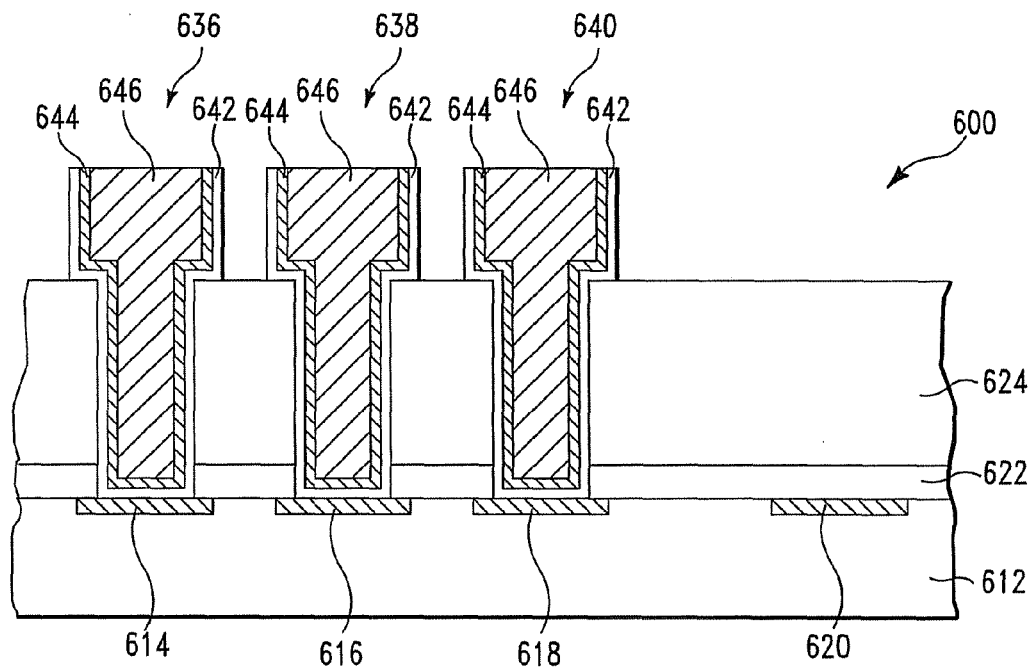
FIG. 65 depicts the structure of FIG. 64 following removal of the second photoresist.

A resist strip is performed to remove the second layer of photoresist 628, using either a reducing ambient on a standard downstream or parallel plate resist strip tool (a reducing ambient such as, $H_2$, $NH_3$, $N_2$, etc., not to include $O_2$; or using a low partial pressure of $O_2$ to avoid corroding the exposed Cu). The resist strip is controlled, either by time or process constraints, to leave most of the PSPI 624 on the substrate 612, e.g., at least 80% or more of the PSPI 624, as shown in FIG. 65.

Figure 66:
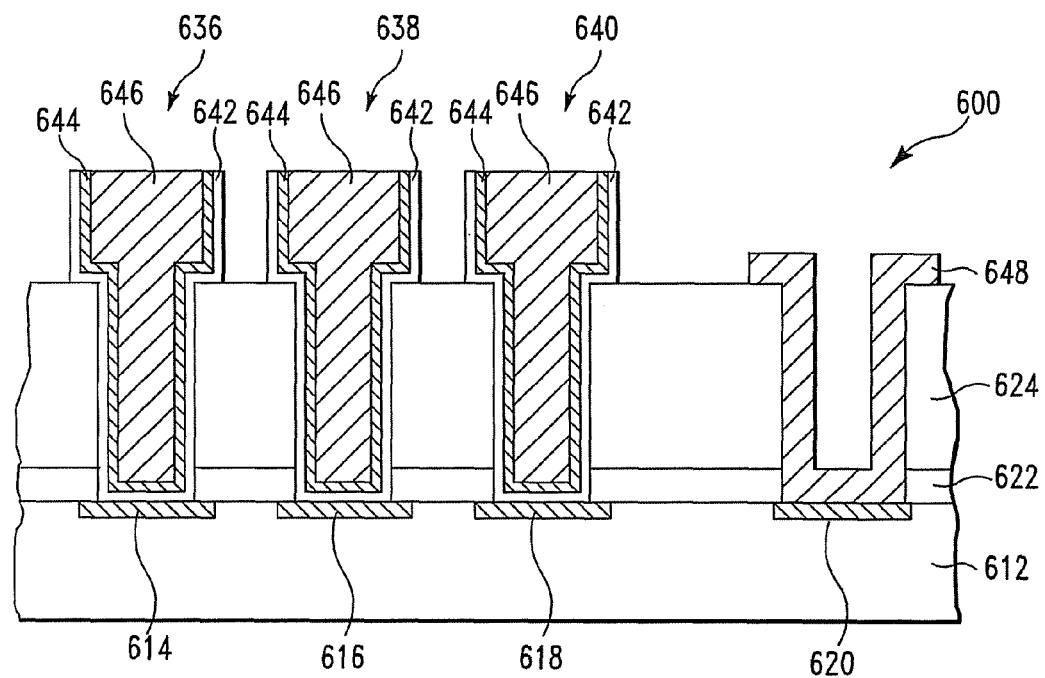
FIG. 66 depicts the structure of FIG. 65 following formation of a electrical interconnection.

As shown in FIG. 66, at least one electrical interconnection, such as a wire bond or soldier bump C4 pad 648 is formed using similar methods described supra. If the RIE or wet etch process used to form the wire bond pad 648 is incompatible with the Cu wire used for the inductor 645, then, prior to formation, a selective conductive layer could be formed over the Cu wires, as discussed supra; or a dielectric passivation layer (not shown), such as 100 nm/100 nm SiN/$SiO_2$, may be deposited using PECVD, etc., and a lithography/RIE step (not shown) may be added to open the via for the wire bond pad 648.

Figure 67:
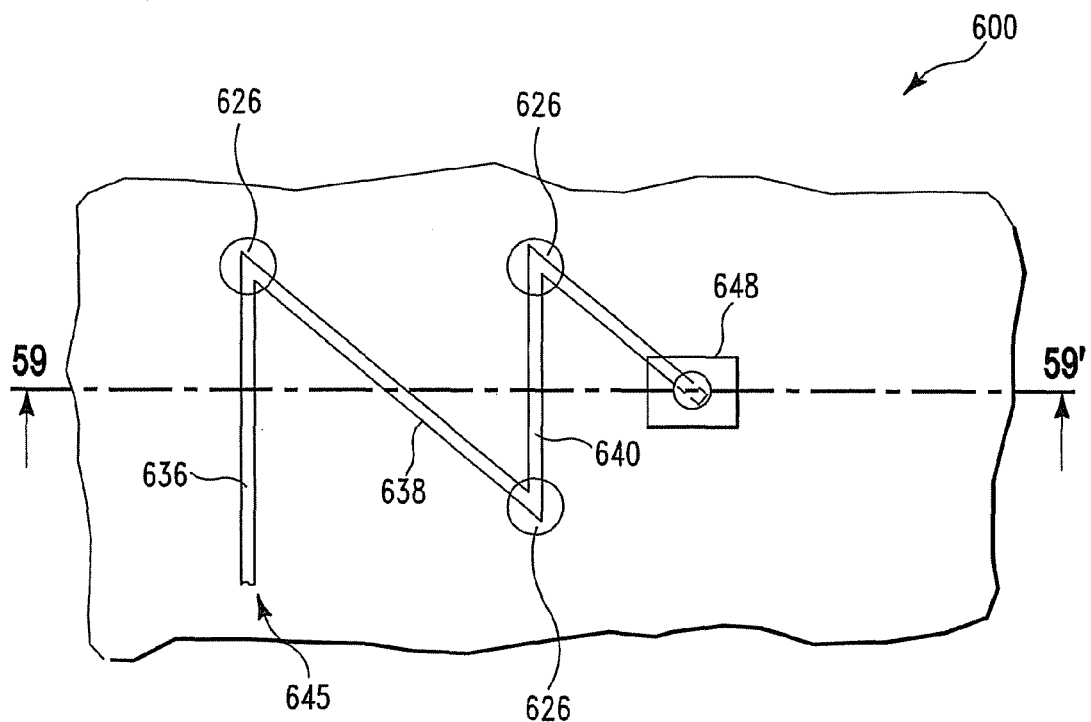
FIG. 67 depicts a top view of the structure of FIG. 66.

FIG. 67 shows the top view of the structure 600, having the conductive vias 626 and first 636, second 638 and third 640 portions of the horizontal inductor 645.

The various embodiments of the present invention described supra provide a transmission line, or in particular, an inductor, formed above a last metal wiring level of a semiconductor substrate. In addition, the present invention provides the formation of at least a portion of an electrical interconnection, such as a wire bond pad, substantially co-planar with the inductor.

We claim:

1. A method of forming a semiconductor substrate, comprising:
   providing a substrate having at least one metal wiring level within the substrate;
   depositing a first insulative layer on a surface of the substrate;
   forming a portion of a wire bond pad within the first insulative layer;
   depositing a second insulative layer on the first insulative layer;
   forming an inductor within the second insulative layer using a patterned plate process; and
   forming a remaining portion of the wire bond pad within the second insulative layer, wherein at least a portion of the wire bond pad is substantially co-planar with the inductor,
   wherein forming the inductor further comprises:
      forming an at least one opening within the second insulative layer;
      depositing a liner on the surface of the substrate and on a surface within the at least one opening within the second insulative layer;
      depositing a seed layer on a surface of the liner;
      removing a portion of the seed layer from the surface of the liner, leaving the seed layer within the at least one opening within the second insulative layer;
      depositing a conductive material within the at least one opening within the second insulative layer, such that the conductive material extends above the surface of the substrate; and
      planarizing the surface of the substrate to remove excess conductive material extending beyond the surface of the substrate,
   wherein between forming the at least one opening within the second insulative layer and depositing the liner, further comprising:
      depositing a layer of photoresist on the surface of the substrate; and
      forming an at least one opening within the layer of photoresist down to the second insulative layer.

2. The method of claim 1, wherein forming a portion of the wire bond pad within the first insulative layer, further comprises:
   forming an at least one opening within the first insulative layer; and
   depositing a conductive layer on the surface of the substrate filling the at least one opening within the first insulative layer.

3. The method of claim 2, wherein forming the remaining portion of the wire bond pad, further comprises:
   patterning and removing the conductive layer, leaving a wire bond pad region;
   depositing a dielectric layer on the surface of the substrate; and
   forming an opening within the dielectric layer down to the wire bond pad region.

4. A method of forming a semiconductor substrate, comprising:
   providing a substrate having at least one metal wiring level within the substrate;
   depositing a first insulative layer on a surface of the substrate;
   forming a portion of a wire bond pad within the first insulative layer;
   depositing a second insulative layer on the first insulative layer;
   forming an inductor within the second insulative layer using a patterned plate process; and
   forming a remaining portion of the wire bond pad within the second insulative layer, wherein at least a portion of the wire bond pad is substantially co-planar with the inductor,
   wherein forming the inductor further comprises:
      forming an at least one opening within the second insulative layer;
      depositing a layer of photoresist on the surface of the substrate;
      forming an at least one opening within the layer of photoresist down to the second insulative layer;
      depositing a liner on the surface of the substrate and on a surface within the at least one opening within the second insulative layer;
      depositing a seed layer on a surface of the liner;
      removing a portion of the seed layer from the surface of the liner, leaving the seed layer within the at least one opening within the second insulative layer;
      depositing a conductive material within the at least one opening within the second insulative layer, such that the conductive material extends above the surface of the substrate; and
      planarizing the surface of the substrate to remove excess conductive material extending beyond the surface of the substrate,
   wherein following planarizing the surface of the substrate, further comprising:
      removing the layer of photoresist.

5. The method of claim 4, wherein forming a portion of the wire bond pad within the first insulative layer, further comprises:
   forming an at least one opening within the first insulative layer; and
   depositing a conductive layer on the surface of the substrate filling the at least one opening within the first insulative layer.

6. The method of claim 5, wherein forming the remaining portion of the wire bond pad, further comprises:
   patterning and removing the conductive layer, leaving a wire bond pad region;
   depositing a dielectric layer on the surface of the substrate; and
   forming an opening within the dielectric layer down to the wire bond pad region.

* * * * *